(12) United States Patent
Qayyum et al.

(10) Patent No.: US 12,550,373 B2
(45) Date of Patent: Feb. 10, 2026

(54) SELECTIVE REMOVAL OF CHANNEL BODIES IN STACKED GATE-ALL-AROUND (GAA) DEVICE STRUCTURES

(71) Applicant: Intel Corporation, Santa Clara, CA (US)

(72) Inventors: Munzarin F. Qayyum, Hillsboro, OR (US); Nicole K. Thomas, Portland, OR (US); Jami A. Wiedemer, Scappoose, OR (US); Jack T. Kavalieros, Portland, OR (US); Marko Radosavljevic, Portland, OR (US); Willy Rachmady, Beaverton, OR (US); Cheng-Ying Huang, Hillsboro, OR (US); Rohit Galatage, Hillsboro, OR (US); Nitesh Kumar, Beaverton, OR (US); Kai Loon Cheong, Beaverton, OR (US); Venkata Vasiraju, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 656 days.

(21) Appl. No.: 17/831,802

(22) Filed: Jun. 3, 2022

(65) Prior Publication Data
US 2023/0395678 A1    Dec. 7, 2023

(51) Int. Cl.
*H10D 30/67* (2025.01)
*H10D 62/10* (2025.01)
*H10D 84/85* (2025.01)

(52) U.S. Cl.
CPC ..... *H10D 30/6735* (2025.01); *H10D 30/6713* (2025.01); *H10D 30/6729* (2025.01); *H10D 30/6757* (2025.01); *H10D 62/121* (2025.01); *H10D 84/853* (2025.01)

(58) Field of Classification Search
CPC .................................................. H10D 62/121
See application file for complete search history.

(56) References Cited

U.S. PATENT DOCUMENTS

| 10,879,308 | B1 * | 12/2020 | Ando | H01L 21/02532 |
| 11,735,669 | B2 * | 8/2023 | Chuang | H01L 21/02293 |
| | | | | 257/288 |

(Continued)

OTHER PUBLICATIONS

U.S. Appl. No. 17/831,800, filed Jun. 3, 2022. 58 pages.

*Primary Examiner* — Evren Seven
(74) *Attorney, Agent, or Firm* — Finch & Maloney PLLC

(57) ABSTRACT

A semiconductor structure includes an upper device stacked over a lower device. In an example, the upper device includes (i) a first source region, (ii) a first drain region, (iii) a body of semiconductor material extending laterally from the first source region to the first drain region, and (iv) a first gate structure at least in part wrapped around the body. In an example, the lower device includes (i) a second source region, (ii) a second drain region, and (iii) a second gate structure at least in part laterally between the second source region and the second drain region. In an example, the lower device lacks a body of semiconductor material extending laterally from the second source region to the second drain region. In another example, the upper device lacks a body of semiconductor material extending laterally from the first source region to the first drain region.

16 Claims, 18 Drawing Sheets

(56) References Cited

U.S. PATENT DOCUMENTS

| | | | |
|---|---|---|---|
| 2013/0341704 A1* | 12/2013 | Rachmady | H01L 21/02603 |
| | | | 977/890 |
| 2018/0175036 A1* | 6/2018 | Ching | H10D 84/0179 |
| 2019/0148376 A1* | 5/2019 | Chanemougame | ......... |
| | | | H10D 30/6219 |
| | | | 257/532 |
| 2019/0172828 A1* | 6/2019 | Smith | H10D 88/00 |
| 2019/0319095 A1* | 10/2019 | Zhang | H01L 21/02532 |
| 2019/0326286 A1* | 10/2019 | Xie | H10D 62/118 |
| 2019/0386011 A1* | 12/2019 | Weckx | H10D 30/43 |
| 2020/0006331 A1* | 1/2020 | Lilak | H10D 62/235 |
| 2020/0098756 A1* | 3/2020 | Lilak | H10D 62/83 |
| 2020/0105751 A1* | 4/2020 | Dewey | H10D 62/235 |
| 2020/0176449 A1* | 6/2020 | Ching | H10D 62/364 |
| 2020/0235092 A1* | 7/2020 | Lilak | H10D 86/215 |
| 2020/0235134 A1* | 7/2020 | Lilak | H10D 86/215 |
| 2020/0295003 A1* | 9/2020 | Dewey | H10D 30/43 |
| 2022/0181441 A1* | 6/2022 | Liebmann | H10D 84/0186 |
| 2023/0197812 A1* | 6/2023 | Murthy | H10D 62/405 |
| | | | 257/467 |
| 2024/0032274 A1* | 1/2024 | Liou | H10B 12/315 |
| 2024/0431087 A1* | 12/2024 | Zhou | H10D 62/121 |

\* cited by examiner

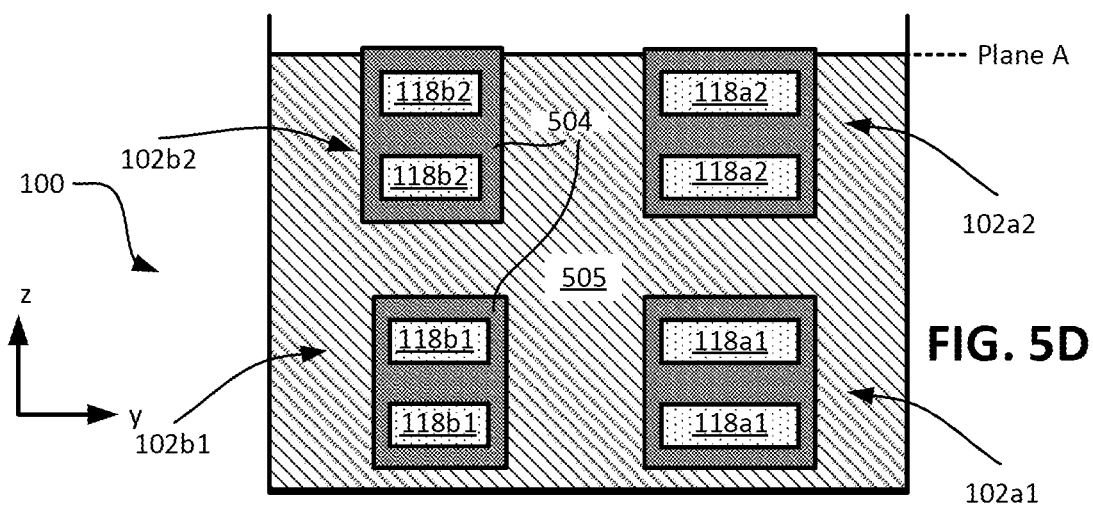
FIG. 5D1
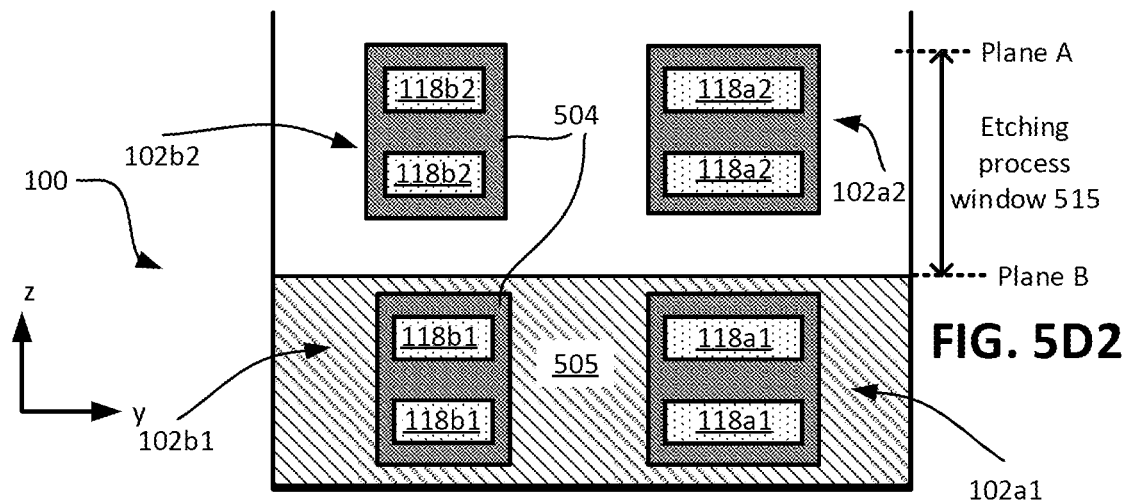
FIG. 5D2
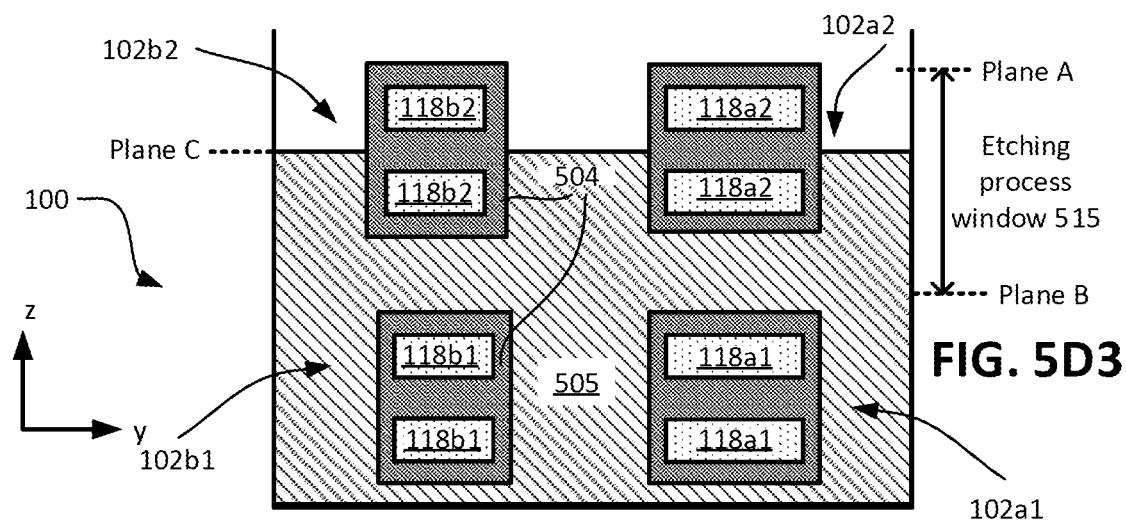
FIG. 5D3

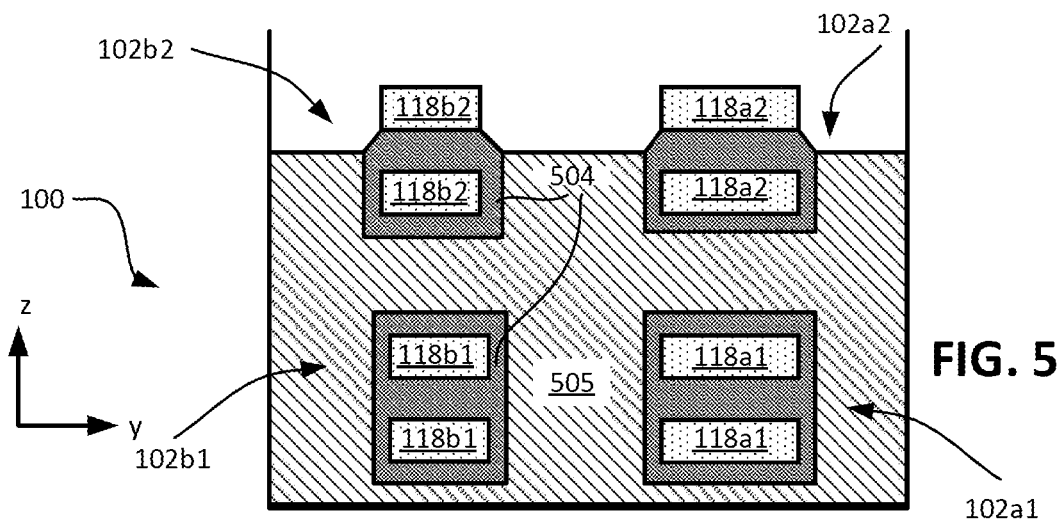
FIG. 5E1
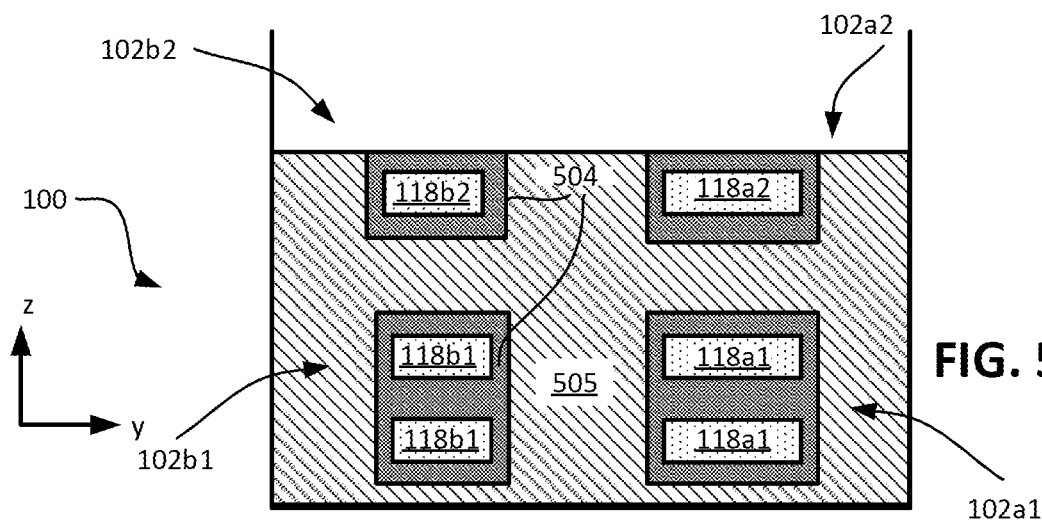
FIG. 5E2
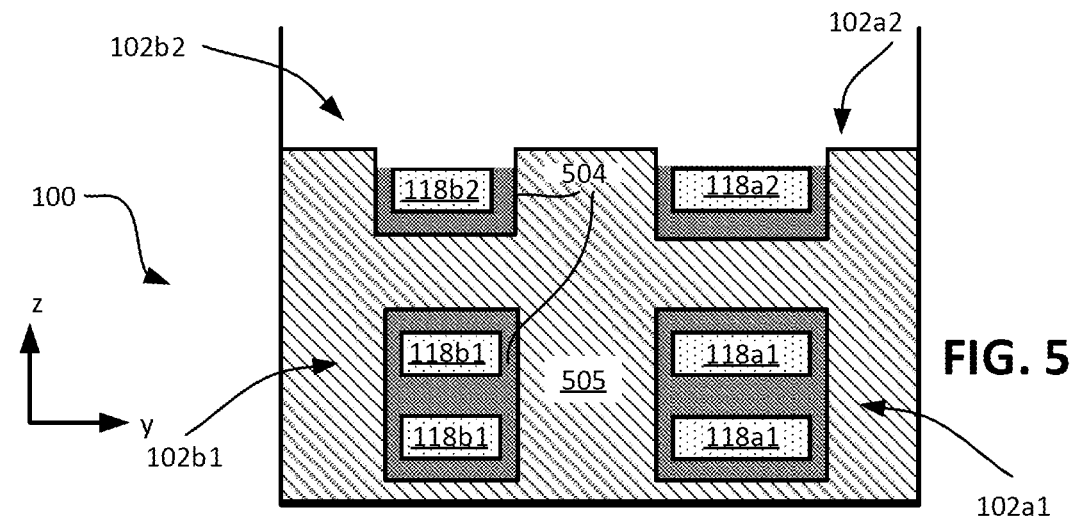
FIG. 5E3

FIG. 5E4

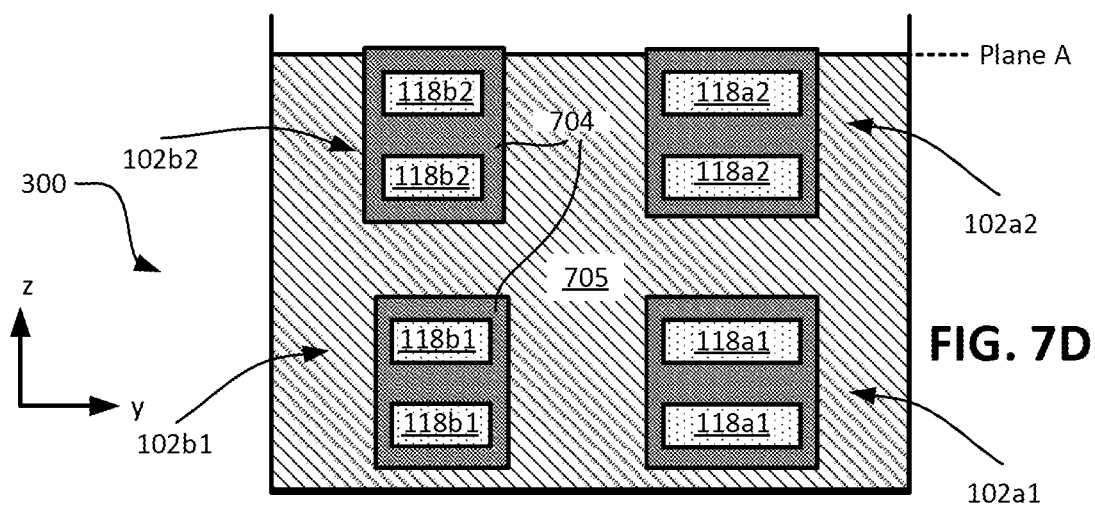
FIG. 7D1
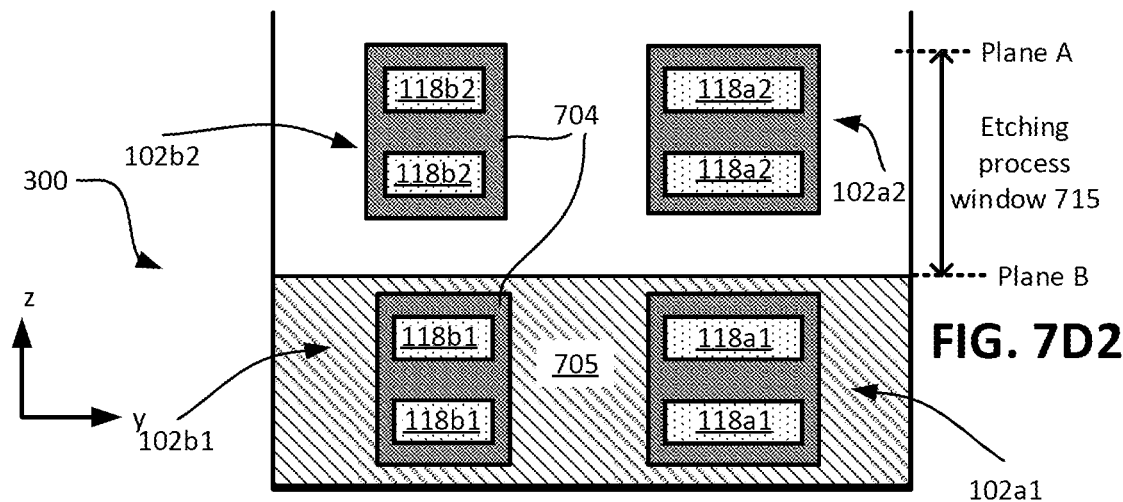
FIG. 7D2
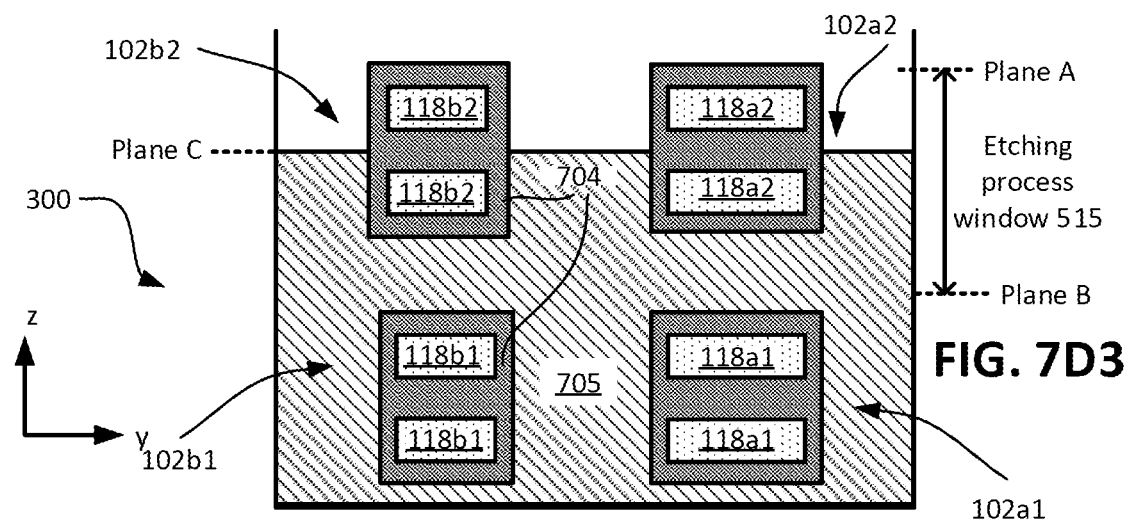
FIG. 7D3

SELECTIVE REMOVAL OF CHANNEL BODIES IN STACKED GATE-ALL-AROUND (GAA) DEVICE STRUCTURES

FIELD OF THE DISCLOSURE

The present disclosure relates to integrated circuits, and more particularly, to stacked semiconductor devices.

BACKGROUND

Integrated circuitry continues to scale to smaller feature dimensions and higher transistor densities. A more recent development with respect to increasing transistor density is generally referred to as three-dimensional (3) integration, which expands transistor density by exploiting the z-dimension (build upwards rather than laterally outwards in the x- and y-dimensions). For example, multiple transistors are stacked in a vertical direction.

BRIEF DESCRIPTION OF THE DRAWINGS

FIGS. 5A, 5B, 5C, 5D1, 5D2, 5D3, 5E1, 5E2, 5E3, 5E4, 5F, 5G, 5H, and 5I collectively illustrate cross-sectional views of an example semiconductor structure in various stages of processing, in accordance with an embodiment of the present disclosure.

FIGS. 7A, 7B, 7C, 7D1, 7D2, 7D3, 7E, 7F, 7G, 7H, 7I, 7J, and 7K collectively illustrate cross-sectional views of an example semiconductor structure in various stages of processing, in accordance with an embodiment of the present disclosure.

Figure 1A:
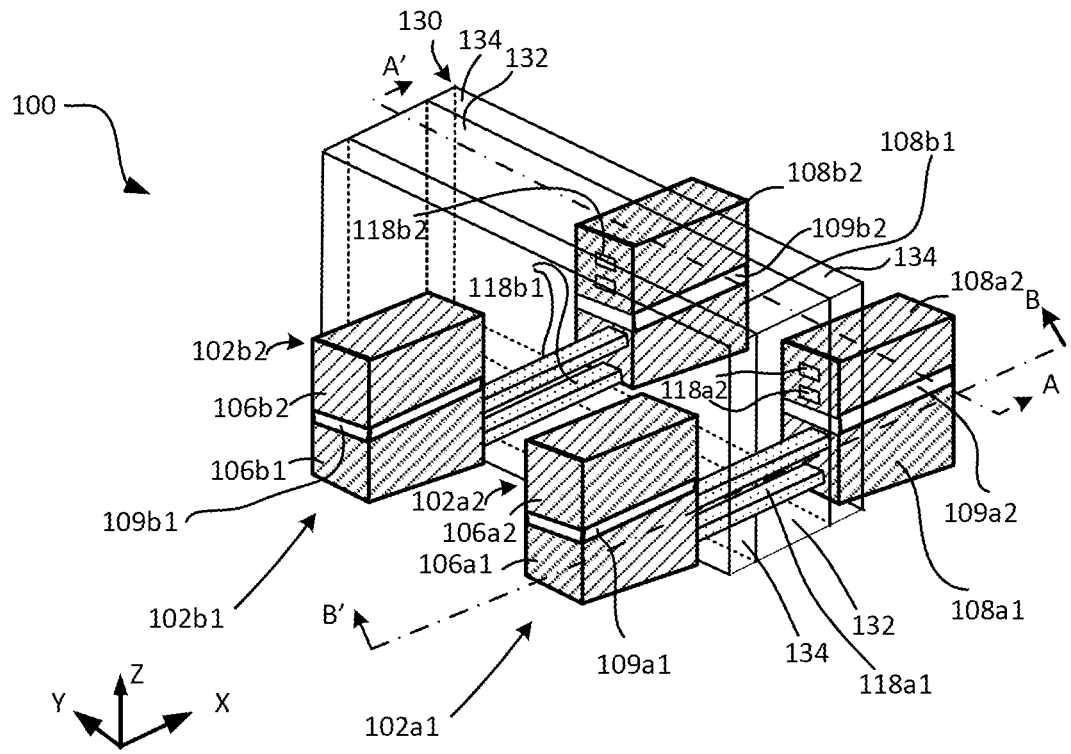
FIGS. 1A-1C illustrate various views of an example semiconductor structure comprising a stacked device configuration including (i) lower devices each having a continuous channel structure, and (ii) upper devices each lacking a continuous channel structure, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Integrated circuit structures including vertically stacked semiconductor devices are discussed herein, wherein an upper device is above a lower device, and wherein one of the upper device or the lower device has its channel regions removed. The channel regions removed from one of the upper or lower devices may include, for example, fin portion, or one or more nanoribbons, nanowires, nanosheets, or any other such semiconductor bodies around which a gate structure can at least partially wrap. In one example embodiment, a semiconductor structure includes an upper device stacked over a lower device. In an example, the upper device includes (i) a first source region, (ii) a first drain region, (iii) a body of semiconductor material extending laterally from the first source region to the first drain region, and (iv) a first gate structure at least in part wrapped around the body. In an example, the lower device includes (i) a second source region, (ii) a second drain region, and (iii) a second gate structure at least in part laterally between the second source region and the second drain region. In an example, the lower device lacks a body of semiconductor material extending laterally from the second source region to the second drain region. In an example, the body of semiconductor material is a nanoribbon, or another GAA channel region (such as a nanowire or a nanosheet) around which a gate structure at least partially wraps around.

In another example embodiment, an integrated circuit structure comprises an upper device stacked over a lower device. In an example, the lower device comprises (i) a lower source region, (ii) a lower drain region, and (iii) a continuous lower body of semiconductor material extending laterally from the lower source region to the lower drain region. In an example, the upper device comprises (i) an upper source region, (ii) an upper drain region, and (iii) a discontinuous upper body of semiconductor material extending laterally from the upper source region to the upper lower drain region.

In yet another example embodiment, an integrated circuit structure comprises an upper device stacked over a lower device. In an example, the upper device comprises a continuous nanoribbon extending laterally from an upper source region to an upper drain region. In an example, the lower device comprises discontinuous nanoribbon having a first end section extending from a lower source region, and a second end section extending from a lower drain region. In an example, discontinuous nanoribbon lacks a middle region between the first and second end sections.

General Overview

A stacked device architecture can in include an upper device stacked above a lower device. In some cases, the upper and lower devices can be arranged in a complementary metal oxide semiconductor (CMOS) architecture. For instance, the upper device can be one of an n-channel metal-oxide semiconductor (NMOS) device or a p-channel metal-oxide semiconductor (PMOS) device, and the lower device can be the other of the NMOS or the PMOS device.

In an example, it may be desirable to make either the upper device or the lower device a dummy or non-operational device, such that only one of the upper or lower devices is operational. Accordingly, techniques are provided herein to depopulate or otherwise remove the channel regions of any one of the upper or lower devices, without removing channel regions of the other of the upper or lower devices. For example, individual ones of the stacked devices are gate-all-around (GAA) devices, in which a gate structure wraps around a channel region that extends laterally between a corresponding source region and a gate region. An example of the channel regions in a GAA device includes nanoribbons. As will be appreciated in light of this disclosure, reference to nanoribbons as channel regions is also intended to include other gate-all-around or multi-gate channel regions, such as nanowires, nanosheets, and other such semiconductor bodies around which a gate structure can wrap. To this end, the use of a specific channel region configuration (e.g., nanoribbon) is not intended to limit the present description to that specific channel configuration. Rather, the techniques provided herein can benefit any number of channel configurations, whether those bodies be nanowires, nanoribbons, nanosheets or some other body around which a gate structure can at least partially wrap (such as the semiconductor bodies of a forksheet device or a fin-based device).

In one embodiment, nanoribbons of one of the upper or lower devices in a stacked GAA device structure are at least in part removed, without removing the nanoribbons of the other of the upper or lower devices of the stacked device structure. For example, prior to removing the nanoribbons, one or more nanoribbons of the upper device extend laterally from an upper source region to an upper drain region of the upper device, and one or more nanoribbons of the lower device extend laterally from a lower source region to a lower drain region of the lower device. In the stacked device architecture, the upper device is stacked above the lower device. For example, the upper source region is above the lower source region, and is separated from the lower source region by a non-conductive isolation region that is between the upper and lower source regions. Similarly, the upper drain region is above the lower drain region, and is separated from the lower drain region by another non-conductive isolation region that is between the upper and lower drain regions. In still other embodiments, the upper and lower source regions and/or the upper and lower drain regions may be connected to one another. In an example, the lower device has a lower gate structure including a lower gate electrode, and the upper device has an upper gate structure including an upper gate electrode. In an example, the lower gate electrode and the upper gate electrode form a continuous and monolithic gate electrode structure for both upper and lower devices. In another example, the lower gate electrode and the upper gate electrode are separated by a non-conductive isolation. A first inner gate spacer separates the gate electrodes of the upper and lower devices from the upper and lower source regions, and a second inner gate spacer separates the gate electrodes of the upper and lower devices from the upper and lower drain regions.

In the example where the nanoribbons of the upper device are removed or depopulated and where the nanoribbons of the lower device are not removed, the lower gate structure of the lower device wraps around the nanoribbons of the lower device. For example, the lower gate structure comprises the lower gate electrode wrapping around the nanoribbons of the lower device, and gate dielectric (and optionally work function metal) between the lower gate electrode and the nanoribbons of the lower device. A nanoribbon of the lower device has (i) a first end section wrapped at least in part by the first inner gate spacer, (ii) a second end section wrapped at least in part by the second inner gate spacer, and (iii) a middle or central section between the two end sections, wherein the lower gate structure wraps around the central section. As discussed, individual nanoribbons of the upper device are removed. Note that in an example, an entirety of the nanoribbons of the upper device may not be removed. For example, end sections of the nanoribbons of the upper device, which are wrapped by the first and second inner gate spacers, are not removed according to some embodiments. However, the central section of the nanoribbons of the upper device are removed. Accordingly, in the upper device, the upper gate structure (e.g., comprising the upper gate electrode and gate dielectric) does not wrap around any central section of any nanoribbon. The end sections of a nanoribbon of the upper device are discontinuous, e.g., not conjoined by a corresponding central section of the nanoribbon. In an example, the gate dielectric in the upper device is on sidewalls of the inner gate spacers and separates the two end sections of individual nanoribbons of the upper device from the upper gate electrode.

In the example where the nanoribbons of the lower device are removed or depopulated and where the nanoribbons of the upper device are not removed, the upper gate structure of the upper device wraps around the nanoribbons of the upper device. For example, the upper gate structure comprises the upper gate electrode wrapping around the nanoribbons of the upper device, and gate dielectric (and optionally work function metal) between the upper gate electrode and the nanoribbons of the upper device. A nanoribbon of the upper device has (i) a first end section wrapped at least in part by the first inner gate spacer, (ii) a second end section wrapped at least in part by the second inner gate spacer, and (iii) a middle or central section between the two end sections, wherein the upper gate structure wraps around the central section. As discussed, individual nanoribbons of the lower device are removed. Note that in an example, an entirety of the nanoribbons of the lower device may not be removed. For example, end sections of the nanoribbons of the lower device, which are wrapped by the first and second inner gate spacers, are not removed according to some embodiments. However, the central section of the nanoribbons of the lower device are removed. Accordingly, in the lower device, the lower gate structure (e.g., comprising the lower electrode and gate dielectric) does not wrap around any central section of any nanoribbon. The end sections of a nanoribbon of the lower device are discontinuous, e.g., not conjoined by a corresponding central section of the nanoribbon. In an example, the gate dielectric in the lower device is on sidewalls of the inner gate spacers and separates the two end sections of individual nanoribbons of the lower device from the lower gate electrode.

In an example and as will be discussed herein later in further detail, prior to removal of the nanoribbons, a vertical separation between nanoribbons of the upper and lower devices is referred to herein as a vertical distance between a top surface of an uppermost nanoribbon of a lower device and a bottom surface of a lowermost nanoribbon of an upper device (i.e., the vertical separation between nearest nanoribbons of the upper and lower devices). In an example and as will be discussed herein in further detail, due to a manner in which the nanoribbons of the upper or lower devices are depopulated (e.g., discussed herein later with respect to FIG. 5D1-5D3 or 7D1-7D3), this vertical separation can be made as small as 3 to 12 nanometers (nm), according to some example embodiments. In an example, this vertical separation is less than 10 nm.

In an example, a vertical stack comprises the upper device and the lower device, and several such stacks each having an upper device and a corresponding lower device can be arranged proximally. For example, a first stack includes a first upper device above a first lower device, and a second stack includes a second upper device above a second lower device, where the first and second stacks are arranged in a horizontal or side-by-side configuration. In an example, one or more of the upper or lower devices, but not necessarily all, lacks corresponding central sections of the nanoribbons. In an example, two lower devices can share a common lower gate structure, and two upper devices can share a common upper gate structure. In another example, a gate cut structure can separate the lower gate electrode of the two adjacent lower devices, and/or a gate cut structure can separate the upper gate electrode of the two adjacent upper devices. Note that an upper (or lower) channel region that has been depopulated can be laterally adjacent to an upper (or lower) channel region that has not been depopulated.

In one example method to form the stacked devices in which the nanoribbons of the upper device are at least in part removed, the nanoribbons of the upper and lower devices are formed, and source and drain regions of the upper and lower devices are formed on two ends of the nanoribbons. Subsequently, the nanoribbons of the upper and lower devices are released. Then a conformal liner is deposited around individual nanoribbons, such that for each device, any gap between corresponding nanoribbons is filled by the liner. Thus, for any upper or lower device, no void or recess is present between the nanoribbons of that device, as any such gap or void is filled with the liner (the conformal growth of the liner on opposing surfaces merges to fill the void between those surfaces). Subsequently, the nanoribbons of the upper and lower devices are fully encapsulated by a sacrificial material that is etch selective to the liner (e.g., an etch process to etch the sacrificial material does not substantially impact the liner). The sacrificial material is recessed, e.g., top portion of the sacrificial material is removed, such that the sacrificial material continues to fully encapsulate the liner around all nanoribbons of the lower device, and exposes at least top surfaces of the liner around nanoribbons of the upper device. In one example, a relatively smaller portion of the sacrificial material may be removed, such that the top surface of the liner around nanoribbons of the upper device are exposed through the recessed sacrificial material. In another example, a relatively larger portion of the sacrificial material may be removed, such that entirety of the nanoribbons of the upper device and the adjacent liner are exposed, and the recessed sacrificial material now barely covers the top surface of the liner around the nanoribbons of the lower device. Thus, there is a relatively large process margin or process window associated with removing the sacrificial material, as also discussed in further detail herein in turn. For example, this relatively large process margin or process window associated with removing the sacrificial material allows the previously discussed vertical separation between nanoribbons of the upper and lower devices to be relatively small, e.g., in the range of 3-12 nm. After the sacrificial material is recessed, the exposed liner and the nanoribbons of the upper device are removed, e.g., etched using one or more isotropic etch processes. The isotropic etch processes may be iterative in nature, e.g., initially removing the liner, then the nanoribbons, then the liner, and so on. Note that these etch processes are selective to the sacrificial material in that they do not substantially impact or etch the sacrificial material or the nanoribbons of the lower device encapsulated by the sacrificial material. After the nanoribbons of the upper device (and the liner surrounding these nanoribbons) are removed, the sacrificial material is removed, e.g., via a selective etch process that removes the sacrificial material without substantially impacting the liner around the nanoribbons of the lower device. Then the liner from around the nanoribbons of the lower device is removed, e.g., using an appropriate selective isotropic etch process, e.g., without substantially impacting the nanoribbons of the lower device. Subsequently, gate dielectric and work function metal are deposited around the nanoribbons of the lower device and also on sidewalls of the first and second inner spacers, and subsequently the gate electrode is deposited. Optionally, an isolation region may be formed between the lower gate electrode and the upper gate electrode. Then the source and drain contacts are processed, to complete formation of the stacked device structure, with nanoribbons of the upper device removed.

In another example method to form the stacked devices in which the nanoribbons of the lower device are at least in part removed or otherwise depopulated, the nanoribbons of the upper and lower devices are formed, and source and drain regions of the upper and lower devices are formed on two ends of the nanoribbons. Subsequently, the nanoribbons of the upper and lower devices are released. Then a first liner is wrapped around individual nanoribbons, such that for each device, any gap between corresponding nanoribbons is filled by the first liner. Thus, for any device (e.g., any upper or lower device), no void or recess is present between the nanoribbons of the device, as any such gap or void is filled with the first liner. Subsequently, the nanoribbons of the upper and lower devices are fully encapsulated by a sacrificial material. The sacrificial material is recessed, e.g., top portion of the sacrificial material is removed, such that the sacrificial material continues to fully encapsulate the first liner around all nanoribbons of the lower device, and exposes at least top surfaces of the first liner around nanoribbons of the upper device. In one example, a relatively smaller portion of the sacrificial material may be removed, such that the top surface of the first liner around nanoribbons of the upper device are exposed through the recessed sacrificial material. In another example, a relatively larger portion of the sacrificial material may be removed, such that entirety of the nanoribbons of the upper device and the adjacent first liner are exposed, and the recessed sacrificial material now barely covers the top surface of the first liner around the nanoribbons of the lower device. Thus, there is a relatively large process margin or process window associated with removing the sacrificial material, as also discussed in further detail herein in turn. For example, this relatively large process margin or process window associated with removing the sacrificial material allows the previously discussed vertical separation between nanoribbons of the upper and lower devices to be relatively small, e.g., in the range of 3-12 nm. After the sacrificial material is recessed, the exposed first liner around the upper device is removed, e.g., etched using one or more isotropic etch processes. The isotropic etch processes is selective and does not substantially etch the upper nanoribbons or the sacrificial material. After the first liner around the nanoribbons of the upper device is removed, the nanoribbons of the upper device are wrapped around by a second liner that is compositionally different from the first liner. Subsequently, the sacrificial material is removed, e.g., via a selective etch process that removes the sacrificial material without substantially impacting the first liner around the nanoribbons of the lower device and also without substantially impacting the second liner around the nanoribbons of the upper device. Then the first liner from around the nanoribbons of the lower device is removed, e.g., using an appropriate selective isotropic etch process, without substantially impacting the second liner around nanoribbons of the upper device. Then the exposed nanoribbons of the lower device are removed or depopulated, e.g., using a selective etch process that doesn't substantially impact the second liner around the nanoribbons of the upper device. Then the second liner around the nanoribbons of the upper device is removed. Subsequently, gate dielectric and work function metal are deposited around the nanoribbons of the upper device and also on sidewalls of the inner spacers, and subsequently the gate electrode is deposited. Optionally, an isolation region may be formed between the lower gate electrode and the upper gate electrode. Then the source and drain contacts are processed, to complete formation of the stacked device structure, with nanoribbons of the lower device removed.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3tomography; or high resolution physical or chemical analysis, to name a few suitable example analytical tools. In particular, in some embodiments, such tools may indicate a vertically stacked device structure that has an upper device above a lower device, where one of the upper or lower devices lacks a complete channel structure (e.g., such as the case where one or more nanoribbons have been removed) between corresponding source and drain regions, and the other of the upper or lower devices has a complete channel structure between corresponding source and drain regions. Such tools may also indicate the device (e.g., which lacks the complete channel structure) having, for example, a first end section of a nanoribbon being at least partially wrapped around by a first inner gate spacer, and a second end section of the nanoribbon being at least partially wrapped around by a second inner gate spacer, wherein a gate electrode of the corresponding device is laterally between the first and second end sections, such that the first and second end sections are discontinuous and not conjoined. Such tools may further be used to detect a channel region of an upper (or lower) device that has been depopulated and that is laterally adjacent to a channel region of an upper (or lower) device that has not been depopulated. Numerous configurations and variations will be apparent in light of this disclosure.

Architecture and Methodology

Figure 1B:
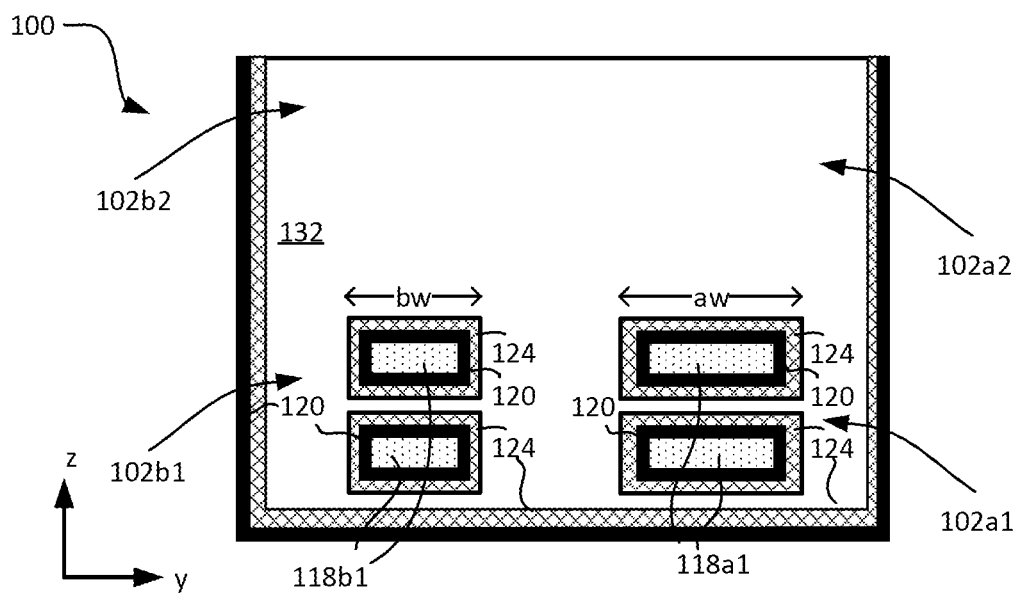
Figure 1C:
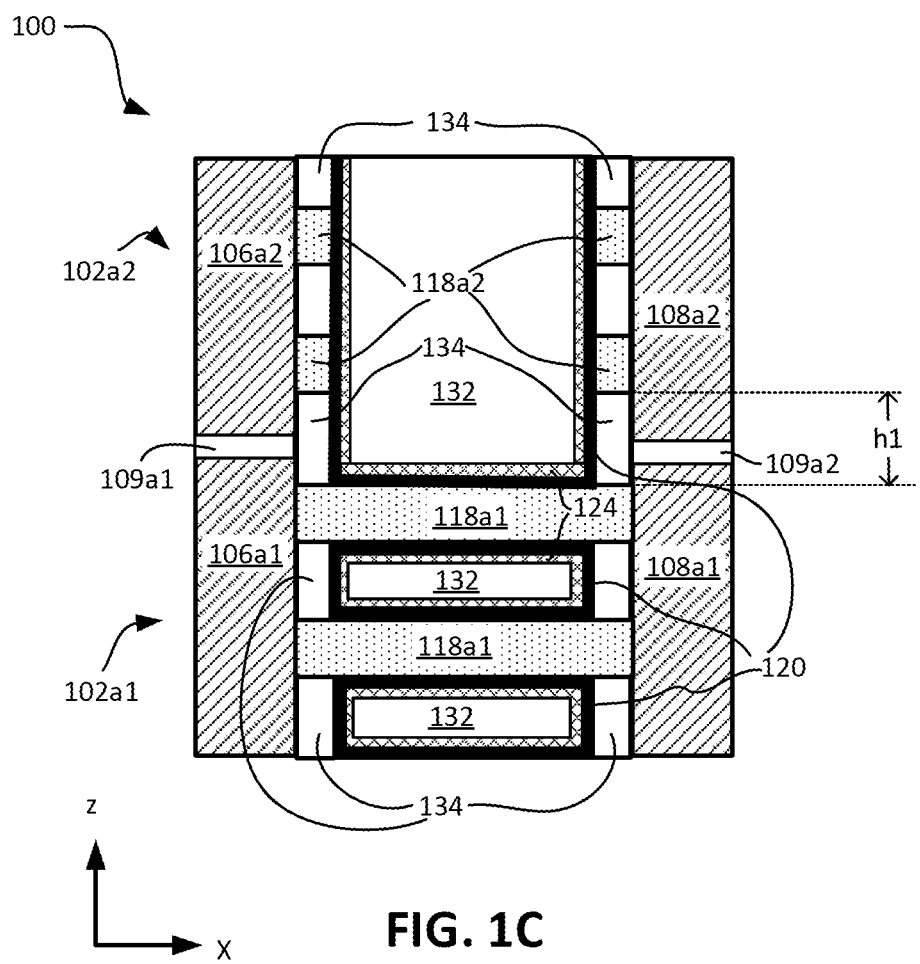

FIG. 1A illustrates a perspective view of an example semiconductor structure 100 (also referred to herein as "structure 100"), FIG. 1B illustrates a cross-sectional view of the semiconductor structure 100, and FIG. 1C illustrates another cross-sectional view of the semiconductor structure 100, where the semiconductor structure 100 comprises a stacked device configuration including (i) lower devices 102*a*1 and 102*b*1 each having a continuous channel structure, and (ii) upper devices 102*a*2 and 102*b*2 each lacking a continuous channel structure, in accordance with an embodiment of the present disclosure.

The cross-sectional view of FIG. 1B is along line A-A' of the perspective view of FIG. 1A. That is, the cross-sectional view of FIG. 1B is along a gate electrode 132 of the structure 100, and this view is also referred to as "gate-cut" view of the structure 100. Thus, the cross-sectional view of FIG. 1B is along a cross-section of nanoribbons 118 of the various devices 102a1, 102b1, and the cross-section of the nanoribbons 118 of the devices 102a1, 102b1 are visible in FIG. 1B.

The cross-sectional view of FIG. 1C is along line B-B' of FIG. 1A. Thus, in the cross-sectional view of FIG. 1C, only the right-most GAA devices 102a1, 102a2 are visible. Also, the cross-sectional view of FIG. 1C is along the length of nanoribbons 118a1 of the device 102a1, and entire length of nanoribbons 118a1 of the device 102a1 are visible in FIG. 1C. Also visible in FIG. 1C is the device 102a2, and the partial and discontinuous nanoribbons 118a2 of the device 102a2. Note that the devices 102b1 and 102b2 are not visible in the cross-sectional view of FIG. 1C.

In an example, the stacked device configuration of the structure 100 includes upper devices and lower devices, formed on the same fin structure. For example, the upper device 102a2 is stacked above the lower device 102a1, and the upper device 102b2 is stacked above the lower device 102b1. Thus, two pairs of stacked devices are illustrated in FIGS. 1A and 1B, although the structure 100 can include any other appropriate number of such stacked devices, such as one, three, or higher number of pairs of such stacked devices.

The semiconductor bodies included in the channel regions of the lower devices can vary in form, but in this example embodiment are in the form of nanoribbons 118a1 for the lower device 102a1 and nanoribbons 118b1 for the lower device 102b1. Thus, the devices 102a1 and 102b1 are nanoribbon transistor devices, although the devices can be any other type of GAA devices. As will be further appreciated in light of this disclosure, reference to nanoribbons is also intended to include other channel regions, such as nanowires, nanosheets, forksheets, and other such semiconductor bodies around which a gate structure can at least partially wrap. To this end, the use of a specific channel region configuration (e.g., nanoribbon) is not intended to limit the present description to that specific channel configuration.

Note that the upper devices 102a2 and 102b2 are dummy devices, in the sense that the devices 102a2 and 102b2 lack a continuous body or channel region. For example, each nanoribbon 118a2 of the device 102a2 comprises two end sections, but lacks a central or middle section that would have conjoined the two end sections of the nanoribbon. A first end section and a second end section of each of the nanoribbons 118a2 of the dummy device 102a2 are visible in FIG. 1C, and only the first end section of each of the nanoribbons 118a2 of the dummy device 102a2 are visible in FIG. 1A. Thus, the upper devices 102a2 and 102b2 lack a channel region surrounded by a gate stack, and cannot conduct any current through any channel region—hence, these upper devices 102a2 and 102b2 are referred to herein as dummy devices.

In an example, a lower device (e.g., device 102a1) is complementary to a corresponding upper device (e.g., device 102a2) stacked above the lower device. For example, the lower devices 102a1, 102b1 can be PMOS devices and the upper devices 102a2, 102b2 can be NMOS devices. In another example, the lower devices 102a1, 102b1 can be NMOS devices and the upper devices 102a2, 102b2 can be PMOS devices. Any other combination may also be possible. In one embodiment, in a device stack, the upper device and the corresponding lower device are configured in a Complementary metal-oxide-semiconductor (CMOS) architecture. As discussed, in the example of FIGS. 1A-1C, the upper devices 102a2 and 102b2 are dummy devices, and hence, an operational CMOS architecture may not be achieved in the structure 100.

In one embodiment, a p-channel device has the corresponding nanoribbons doped with n-type dopants (e.g., phosphorous or arsenic), and an n-channel device has the corresponding nanoribbons doped with p-type dopants (e.g., boron). Thus, in an example, the nanoribbons comprise appropriately doped semiconductor material, such as appropriately doped silicon or another appropriate semiconductor material. Note that as discussed, nanoribbons of the upper devices are discontinuous, e.g., includes end sections, but lacks a central section between two end sections.

Although in FIGS. 1A-1B the nanoribbons 118a1 (or the nanoribbons 118b1) extend horizontally and are stacked vertically, the present disclosure contemplates nanoribbons in a variety of configurations that include planar nanoribbon transistors, nanoribbons that extend vertically and are stacked horizontally, and other arrangements, as will be appreciated.

With further reference to FIGS. 1A and 1C, the lower device 102a1 includes a source region 106a1 and a drain region 108a1, which are on two opposite sides of a gated channel region. Similarly, the upper device 102a2 includes a source region 106a2 and a drain region 108a2.

According to some embodiments, the source and drain regions 106, 108 are epitaxial regions that are provided using an etch-and-replace process. In other embodiments one or both of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. Any semiconductor materials suitable for source and drain regions can be used (e.g., group IV and group III-V semiconductor materials).

As illustrated in FIGS. 1A and 1C, in an example, the source regions 106a1 and 106a2 are separated by a non-conductive isolation region 109a1. Similarly, the drain regions 108a1 and 108a2 are separated by a non-conductive isolation region 109a2. In an example, the isolation region 109a1 prevents the source region 106a1 from contacting the source region 106a2, and the isolation region 109a2 prevents the drain region 108a1 from contacting the drain region 108a2. For example, the isolation region 109a1 is between and electrically isolates source regions of the lower device 102a1 and the upper device 102a2, and the isolation region 109a2 is between and electrically isolates drain regions of the lower device 102a1 and the upper device 102a2.

Similarly, the lower device 102b1 includes a source region 106b1 and a drain region 108b1 (see FIG. 1A). Similarly, the corresponding upper device 102b2 includes a source region 106b2 and a drain region 108b2. As illustrated in FIG. 1A, in an example, the source regions 106b1 and 106b2 are separated by a non-conductive isolation region 109b1. Similarly, the drain regions 108b1 and 108b2 are separated by a non-conductive isolation region 109b2. In an example, the isolation region 109b1 electrically isolates the source region 106b1 from the source region 106b2, and the isolation region 109b2 electrically isolates the drain region 108b1 from the drain region 108b2.

Although not illustrated in FIGS. 1A-1C, each of the source and drain regions 106, 108 of the various devices 102 may have a corresponding conductive source or drain contact thereon. For example, there may be a source contact above the source region 106a2. Similarly, there may be a source contact that is below or on a side of the source region 106a1. Any other appropriate source and drain contact configuration may also be possible. Other source and drain regions may also have similar corresponding source or drain contacts thereon. The conductive source or drain contacts may be any suitably conductive material. In some embodiments, conductive contacts include one or more of the same metal materials as gate electrode, or a different conductive material. In some embodiments, the source and drain contacts may include aluminum or tungsten, although any suitable conductive metal or alloy can be used, such as silver, nickel-platinum, or nickel-aluminum, for example. In some embodiments, one or more of the source and drain contacts may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the source and drain contact regions, such as adhesion layers (e.g., titanium nitride) and/or liner or barrier layers (e.g., tantalum nitride), if so desired. In some embodiments, a contact resistance reducing layer may be present between a given source or drain region and its corresponding source or drain contact, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding source or drain region, for example.

The devices 102a1, 102a2, 102b1, and 102b2 comprise a corresponding gate structure 130. Note that the gate structure of FIG. 1A is illustrated as being transparent in order to better show a perspective view of the channel region.

Figure 2A:
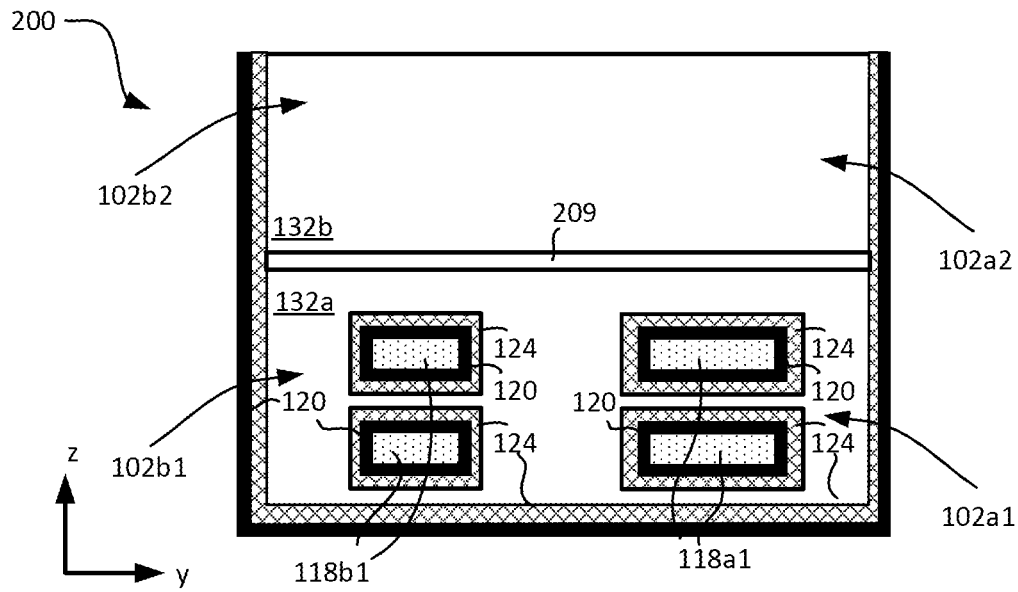
FIGS. 2A and 2B illustrate various cross-sectional views of a semiconductor structure comprising a stacked device configuration including (i) lower devices each having a continuous channel structure, and (ii) upper devices each lacking a continuous channel structure, wherein a lower gate electrode of a lower device and an upper gate electrode of a corresponding upper device are separated by a non-conductive isolation region, in accordance with an embodiment of the present disclosure.
Figure 2B:
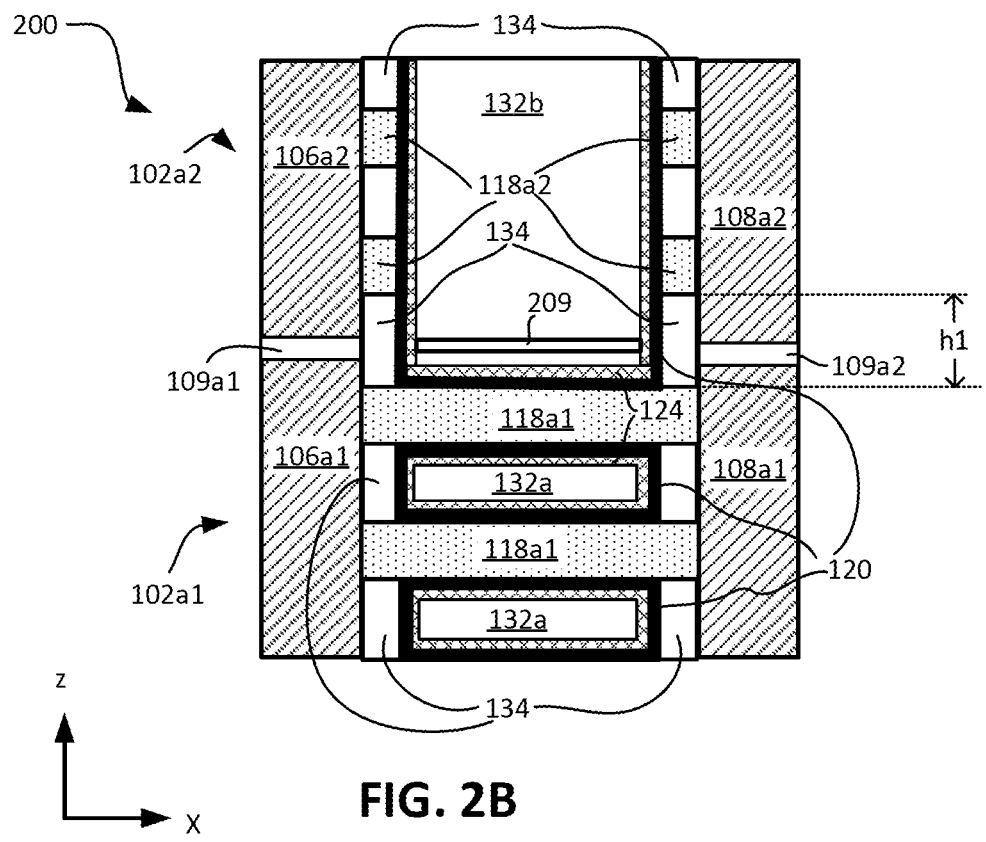

For example, referring to FIGS. 1B and 1C, the devices 102a1, 102a2, 102b1, and 102b2 comprise a gate structure that includes a gate electrode 132. Thus, in the example of FIGS. 1A-1C, the gate electrode 132 is to common to both upper and lower devices (note that FIGS. 2A-2B illustrate an example that has split gate, e.g., two different gate structures for the upper devices and the lower devices, respectively).

Referring to the lower devices 102a1 and 102b1, the gate electrode 132a at least in part wraps the nanoribbons 118a1 of the lower device 102a1 (see FIGS. 1B and 1C), and also at least in part wraps the nanoribbons 118b1 of the lower device 102b1 (see FIG. 1B). In one embodiment, the gate structure includes a gate dielectric 120 (not illustrated in FIG. 1A but illustrated in FIGS. 1B and 1C) that wraps around each of the nanoribbons 118a1 and 118b1 of the devices 102a1 and 102b1, respectively. The gate electrode 132 wraps around the gate dielectric 120. The gate dielectric 120 is, thus, between the gate electrode 132 and the nanoribbons 118a1, 118b1. Note that FIG. 1A does not illustrate the gate dielectric 120, for purposes of illustrative clarity.

In an example, the gate electrode 132 may include any sufficiently conductive material, such as a metal, metal alloy, or doped polysilicon. The gate electrode may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

The gate dielectric 120 may include a single material layer or multiple stacked material layers. The gate dielectric may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. The high-k dielectric material (e.g., hafnium oxide) may be doped with an element to affect the threshold voltage of the given semiconductor device. According to some embodiments, the doping element used in gate dielectric 120 is lanthanum. In some embodiments, the gate dielectric can be annealed to improve its quality when high-k dielectric material is used. In some embodiments, the gate dielectric 120 includes a first layer (e.g., native oxide of nanoribbons 118, such as silicon dioxide or germanium oxide or SiGe-oxide) on the nanoribbons, and a second layer of high-k dielectric (e.g., hafnium oxide) on the first layer.

The combination of gate dielectric 120 and gate electrode 132 and any work function materials generally forms a gate structure for each of the devices 102a1, 102b1, 102a2, 102b2. In one embodiment, the gate electrode 132 may be interrupted between any adjacent devices 102a1 and 102b1 by a gate cut structure. In an example, due to conformal deposition of the gate dielectric 120, the gate dielectric 120 may also be present on inner walls of the inner gate spacers 134, as seen in FIGS. 1B and 1C.

In one embodiment, one or more work function materials 124 may be included around the nanoribbons 118a1 and 118b1, as illustrated in FIGS. 1B and 1C. Note that work function materials 124 are called out separately, but may be considered to be part of the gate electrodes. In this manner, a gate electrode may include multiple layers or components, including one or more work function materials, gate fill material, capping or resistance-reducing material, to name a few examples. In some embodiments, a p-channel device may include a work function metal having titanium, and an n-channel device may include a work function metal having tungsten or aluminum, although other material and combination may also be possible. In some other embodiments, the work function metal may be absent around one or more nanoribbons 118. In still other embodiments, there may be insufficient room for any gate fill material, after deposition of work function material (i.e., a given gate electrode may be all work function material and no fill material).

Referring now to the upper devices 102a2 and 102b2, the upper devices comprise a gate structure that includes the gate electrode 132, which is common to both upper and lower devices (although a gate cut may separate the gate electrode 132 in two isolated vertical sections). Note that as the upper devices 102ba2 and 102b2 do not include any continuous nanoribbons, the gate electrode 132 does not wrap around any nanoribbons of the upper devices.

In one embodiment, the gate structure of the upper devices 102a2 and 102b2 also includes a gate dielectric 120 (not illustrated in FIG. 1A but illustrated in FIGS. 1B and 1C). As the upper devices lack do not include continuous nanoribbons, the gate dielectric 120 of the upper devices does not wrap around any corresponding nanoribbon. In an example, the gate dielectric 120 of the upper devices are on sidewalls of inner gate spacers 134 (discussed herein later), see FIGS. 1B and 1C. Thus, the gate dielectric 120 of the upper devices separate the gate electrode 132b of the upper devices from the inner gate spacers 134 and the corresponding source and drain regions.

As illustrated in FIGS. 1A and 1C, inner gate spacers 134 are between the gate electrode 132 and the source regions 106a1, 106a2, and also between the gate electrode and the drain regions 108a1, 108a2. Thus, the inner gate spacers 134 are on the source regions 106a1, 106a2, and also on the drain regions 108a1, 108a2. The inner gate spacers 134 may be appropriate insulator layers (e.g., interlayer dielectric) or dielectric material that electrically isolates the gate electrode 132 from the source and drain regions. In an example, the inner gate spacers 134 comprises silicon nitride ($Si_3N_4$) or other suitable non-conductive material, as will be appreciated.

For the lower device 102a1, the corresponding nanoribbons 118a1 extend within and through the inner gate spacers 134, to make contact with the corresponding source region 106a1 and to make contact with the corresponding drain region 108a1, e.g., as illustrated in FIG. 1C. Similarly, for the lower device 102b1, the corresponding nanoribbons 118b1 extend within and through the inner gate spacers 134, to make contact with the corresponding source region 106b1 and to make contact with the corresponding drain region 108b1.

For the upper device 102a2 illustrated in FIG. 1C, the end sections of the nanoribbons 118a2 extend within the inner gate spacers 134, and make contact with the corresponding source region 106a2 and corresponding drain region 108a2. For example, a first end section of a nanoribbon 118a2 extends within a first inner gate spacer and makes contact with the source region 106a2, and a second end section of the nanoribbon 118a2 extends within a second inner gate spacer and makes contact with the drain region 108a2, see FIG. 1C. Note that the first and second end sections of the nanoribbon 118a2 are coplanar, and there is no central section of the nanoribbon between the two end sections, as illustrated and variously discussed herein.

In the example illustrated in FIG. 1B, a horizontal width of the nanoribbons 118a1 is different from a width of the nanoribbons 118b1, although in other examples the nanoribbons 118a1 and 118b1 may have substantially the same width, where the width is measured in a horizontal direction that is perpendicular to a length of the nanoribbons. For example, as illustrated in FIG. 1B, a width of the nanoribbons 118a1 is aw, and a width of the nanoribbons 118b1 is bw, where in an example, aw is greater than bw. For example, aw may be greater than bw by at least 2 nm, or 4 nm, or 6 nm, or 8 nm, or 10 nm.

In an example and as illustrated in FIG. 1C, a vertical distance (e.g., in Z-direction) between a top surface of a top-most nanoribbon of a lower device (e.g., a top-most of the nanoribbons 118a1 of the lower device 102a1) and a bottom surface of a partially formed bottom-most nanoribbon of a corresponding upper device (e.g., an end section of a bottom-most of the partial nanoribbons 118b1 of the upper device 102a2, see FIG. 1C) is denoted as h1. Thus, h1 is a vertical separation between nanoribbons of the lower device 102a1 and upper device 102a2. In an example, the vertical separation h1 is in the range of 3-50 nm, or in the sub-range of 3-40 nm, 3-nm, 3-12 nm, 3-20 nm, 3-10 nm, 3-8 nm, 5-40 nm, 5-30 nm, 5-20 nm, 5-10 nm, 5-8 nm, or another appropriate subrange. As will be discussed herein subsequently (e.g., see FIGS. 5D1, 5D2, there is a wide process margin in an etch process, e.g., to remove a sacrificial material, while depopulating or removing the nanoribbons of the upper devices 102a2, 102b2. Due to this wide process margin, it is possible to have significantly small vertical separation h1 between the top-most nanoribbon of the lower devices and bottom-most partially removed nanoribbon of the upper devices, e.g., which can be as small as in the above discussed subrange of 3 to 12 nm.

Figure 1D:
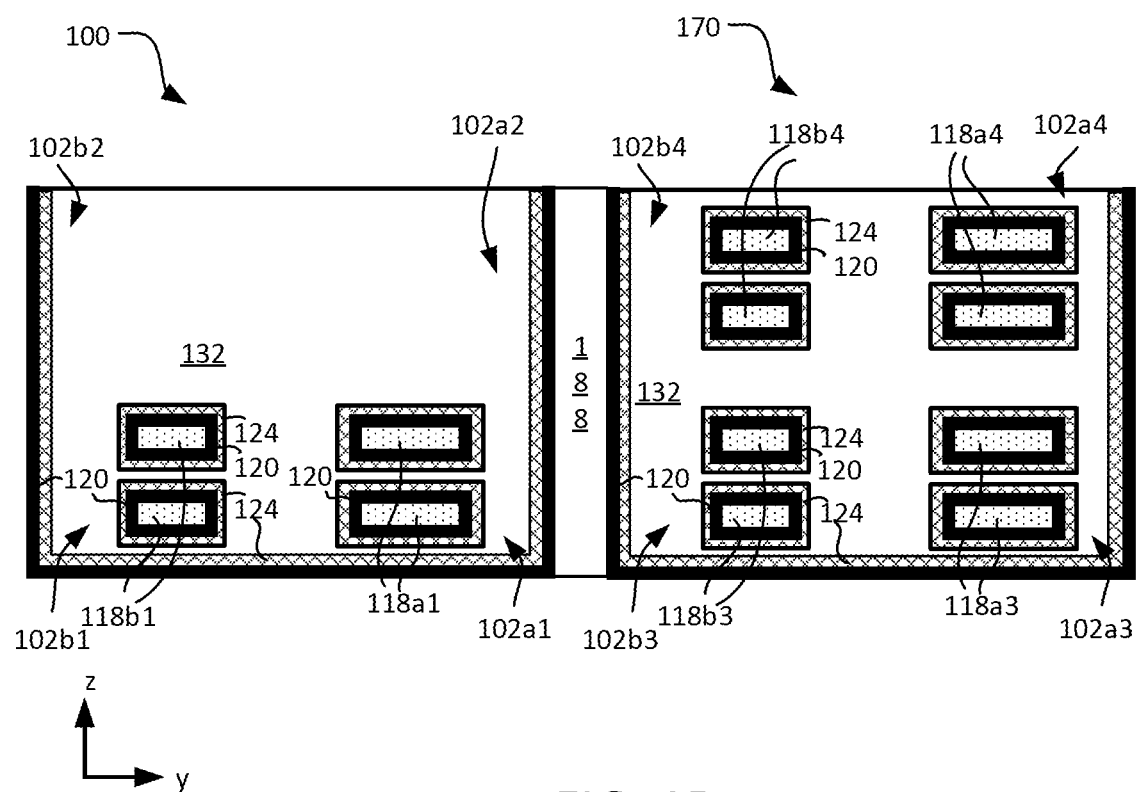
FIG. 1D illustrates a perspective view of the example semiconductor structure of FIGS. 1A-1C that is adjacent to another semiconductor structure having a stacked device configuration including (i) lower devices each having a continuous channel structure, and (ii) upper devices also each having a continuous channel structure, in accordance with an embodiment of the present disclosure.

FIG. 1D illustrates a perspective view of the example semiconductor structure 100 of FIGS. 1A-1C that is adjacent to another semiconductor structure 170 having a stacked device configuration including (i) lower devices 102a3 and 102b3 each having a continuous channel structure, and (ii) upper devices 102a4 and 102b4 also each having a continuous channel structure, in accordance with an embodiment of the present disclosure. Thus, FIG. 1D, the two structures 100 and 170 are adjacent to each other on the same die and separated by an isolation structure 188. The isolation structure 188 may be a gate cut, a shallow trench isolation (STI) structure, or a non-conductive wall separating the two structures 100 and 170. As discussed with respect to FIGS. 1A-1C, within the structure 100, the nanoribbons of the upper devices 102a2 and 102b2 have been depopulated or at least partly removed. In contrast, the nanoribbons 118a4 and 118b4 of the upper devices 102a4 and 102b4, respectively, of the structure 170 have not been depopulated or removed. For example, when the structure 100 is processed to selectively remove the nanoribbons of the upper devices of the structure 100, the structure 170 is masked such that the nanoribbons of the upper devices 102a4 and 102b4 of the structure 170 are not removed. Various components of the structure 170 will be apparent, based on the discussion with respect to the structure 100 in FIGS. 1A-1C.

FIGS. 2A and 2B illustrate various cross-sectional views of a semiconductor structure 200 comprising a stacked device configuration including (i) lower devices 102a1 and 102b1 each having a continuous channel structure, and (ii) upper devices 102a2 and 102b2 each lacking a continuous channel structure, wherein a lower gate electrode 132a of a lower device and an upper gate electrode 132b of a corresponding upper device are separated by a non-conductive isolation region 209, in accordance with an embodiment of the present disclosure.

The structure 200 of FIGS. 2A and 2B are respectively similar to the structure 100 of FIGS. 1B and 1C, and similar components are labelled similarly in the structures 100 and 200. However, in the structure 200, the non-conductive isolation region 209 separates and electrically isolates (i) a lower gate electrode 132a of the lower devices 102a1, 102b1, and (ii) an upper gate electrode 132b of the upper devices 102a2, 102b2. Thus, the gate electrode 132 of the structure 100 of FIGS. 1A-1C is separated in two separate gate electrodes 132a and 132b in the structure 200 of FIGS. 2A-2B, e.g., separated by the isolation region 209. The use of the common-gate in the structure 100 or the split-gate in the structure 200 is based on an application area or circuit in which the stacked upper and lower devices are to be used.

Figure 3A:
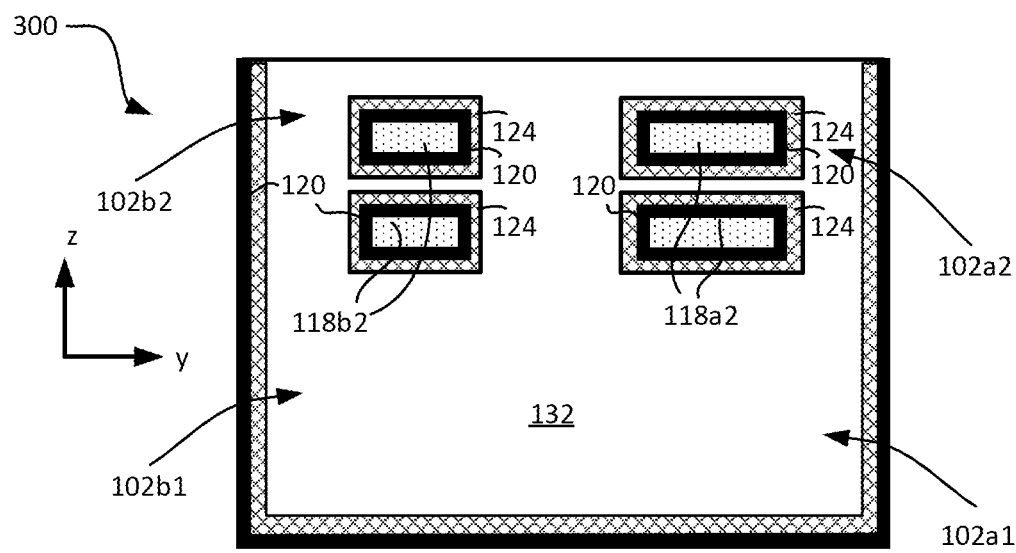
FIGS. 3A and 3B illustrate various cross-sectional views of an example semiconductor structure that includes a stacked device configuration including (i) lower devices each lacking a continuous channel structure, and (ii) upper devices each having a continuous channel structure, in accordance with an embodiment of the present disclosure.
Figure 3B:
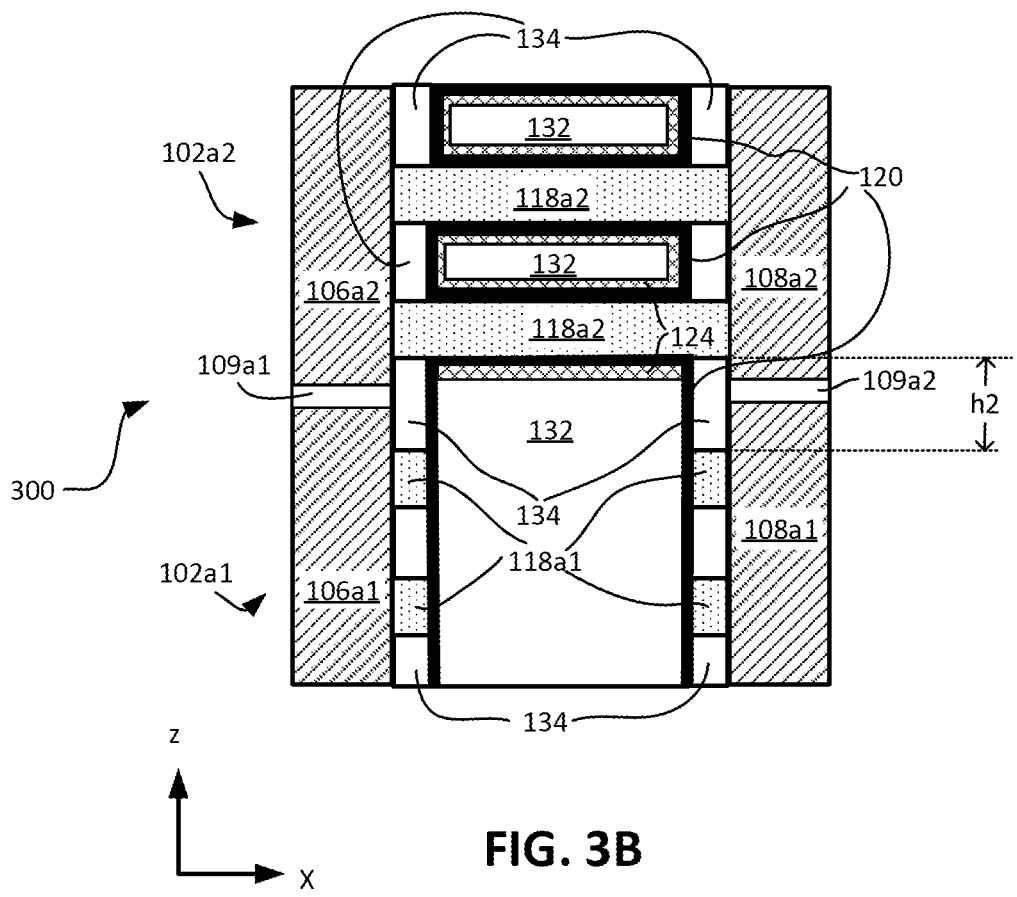

FIGS. 3A and 3B illustrate various cross-sectional views of an example semiconductor structure 300 (also referred to herein as "structure 300") that includes a stacked device configuration including (i) lower devices 102a1 and 102b1 each lacking a continuous channel structure, and (ii) upper devices 102a2 and 102b2 each having a continuous channel structure, in accordance with an embodiment of the present disclosure. Various components of the structure 300 of FIGS. 3A-3B are at least in part similar to the corresponding components of the structure 100 of FIGS. 1A-1D, and similar components are labelled the same in the two structures 100, 300. For example, similar to the structure 100, the structure 300 comprises the lower device 102a1 and the upper device 102a2 above the lower device 102a2; and also comprises the lower device 102b1 and the upper device 102b2 above the lower device 102b2. However, in the structure 100 of FIGS. 1A-1D, the nanoribbons 118a2 and 118b2 of the upper devices were at least partially removed. In contrast, in the structure 300, the nanoribbons 118a1 and 118b1 of the lower devices 102a1 and 102b1, respectively, are at least partially removed, as illustrated in FIGS. 3A and 3B. Thus, each lower device in the structure 300 of FIGS. 3A-3B has discontinuous channel structure, e.g., similar to the discontinuous channel structure of the upper devices in the structure 100 of FIGS. 1A-1D. The structure 300 will be apparent, based on the above discussion and the discussion with respect to FIGS. 1A-1D herein previously.

Figure 4:
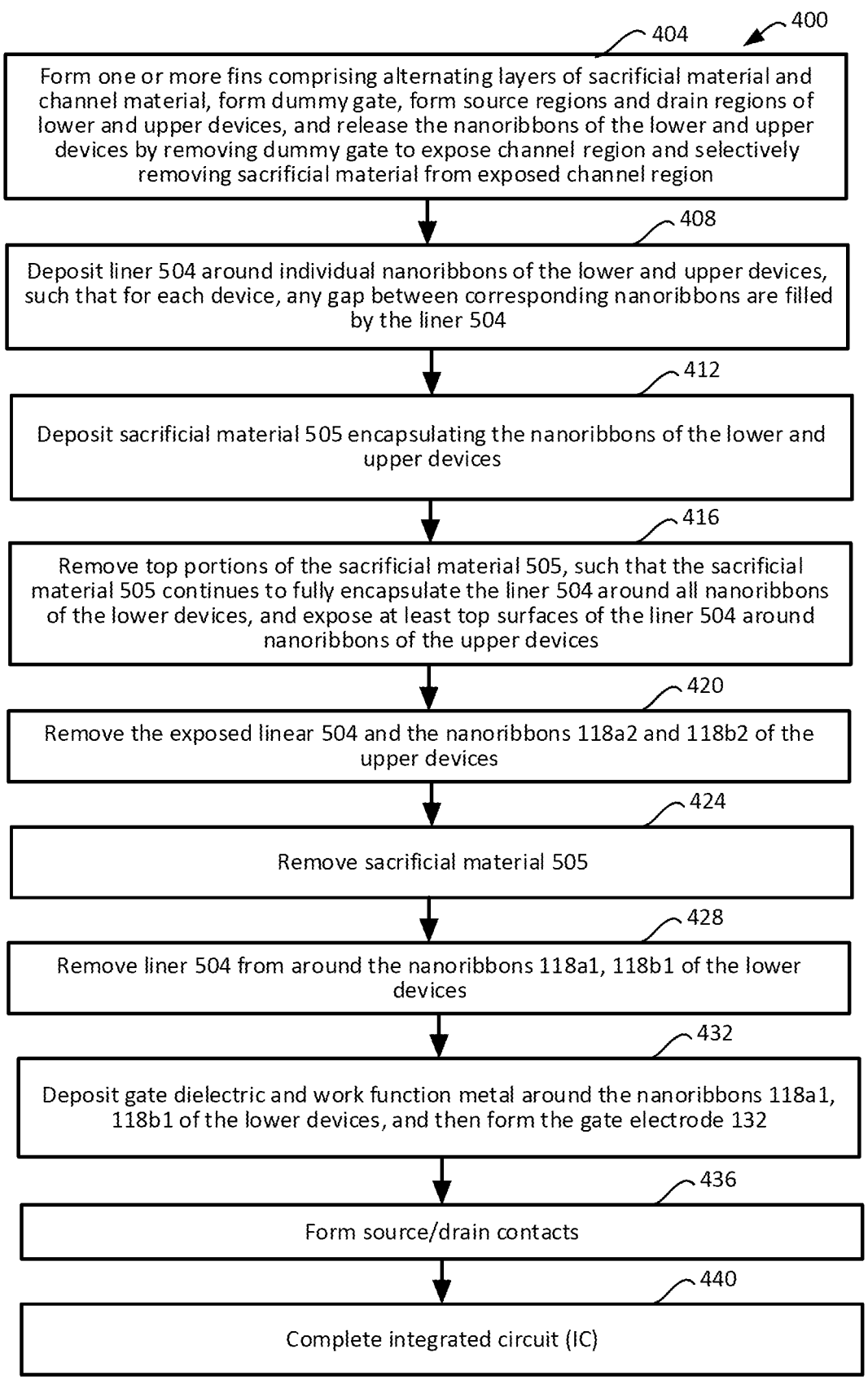
FIG. 4 illustrates a flowchart depicting a method of forming the example nanoribbon semiconductor structure of FIGS. 1A-1C, in accordance with an embodiment of the present disclosure.

FIG. 4 illustrates a flowchart depicting a method 400 of forming the example nanoribbon semiconductor structure 100 of FIGS. 1A-1C, in accordance with an embodiment of the present disclosure. FIGS. 5A, 5B, 5C, 5D1, 5D2, 5D3, 5E1, 5E2, 5E3, 5E4, 5F, 5G, 5H, and 5I collectively illustrate cross-sectional views of an example semiconductor structure (e.g., the semiconductor structure 100 of FIGS. 1A-1C) in various stages of processing, in accordance with an embodiment of the present disclosure. FIGS. 4 and 5A-5I will be discussed in unison. The cross-sectional views of FIGS. 5A-5I correspond to the cross-sectional view of FIG. 1B.

Referring to FIG. 4, the method 400 includes, at 404, forming one or more fins comprising alternating layers of sacrificial material and channel material of one or more upper devices (e.g., devices 102a2, 102b2) and one or more lower devices (e.g., devices 102a1, 102b1), forming dummy gate, forming source regions and drain regions of lower and upper devices (e.g., source regions 106a1, 106a2, and drain regions 108a1, 108a2), and releasing the nanoribbons (e.g., nanoribbons 118a1 of device 102a1, nanoribbons 118a2 of device 102a2, nanoribbons 118b1 of device 102b1, and nanoribbons 118b2 of device 102b2) of the lower and upper devices by removing the dummy gate to expose the channel region and then selectively removing sacrificial material from exposed channel region. The final structure subsequent to process 404 is illustrated in the cross-sectional view of FIG. 5A. The process 404 may include any appropriate techniques for forming nanoribbons of a stacked GAA device architecture having a lower device, and an upper device stacked above the lower device. As discussed herein previously, the upper devices are one of PMOS or NMOS devices, and the lower devices are another of PMOS or NMOS devices.

Figure 5A:
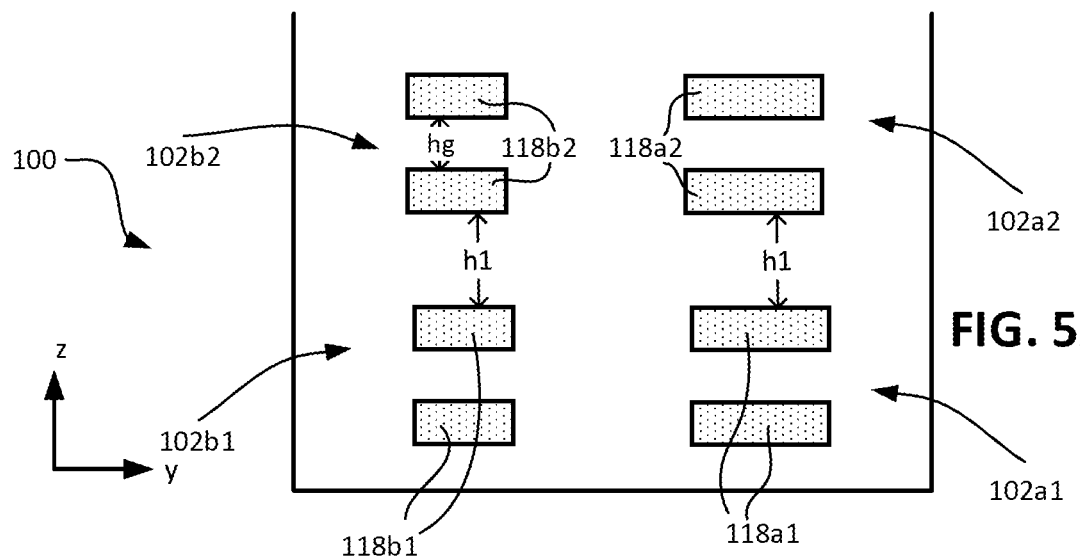
Figure 5B:
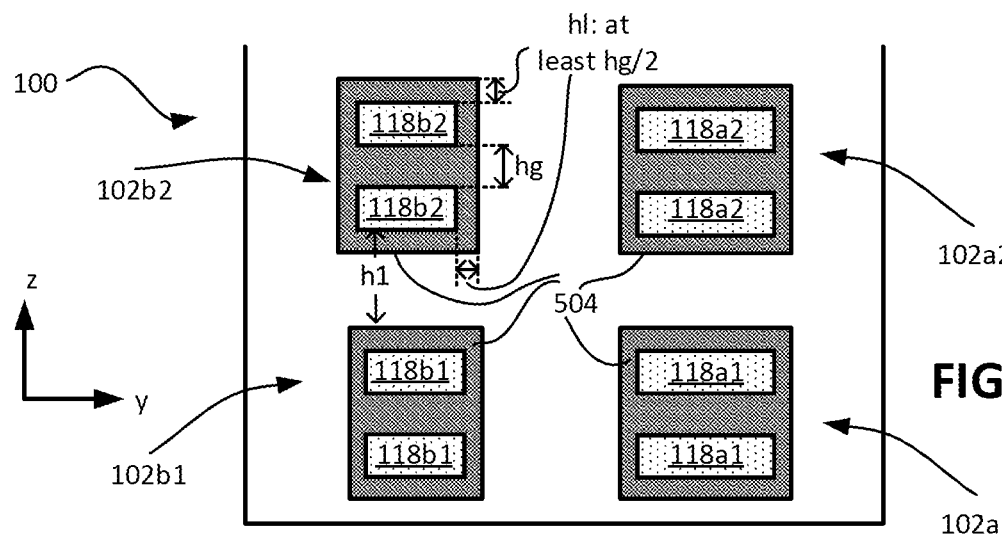

Referring again to FIG. 4, the method 400 then proceeds from 404 to 408, where liner 504 encapsulating or wrapping around the nanoribbons of the lower and upper devices are deposited, such that for each device, any gap between corresponding nanoribbons is filled by the liner 504, e.g., as illustrated in FIG. 5B. In an example, the linear 504 are deposited using a conformal deposition technique, such as atomic layer deposition (ALD), chemical vapor deposition (CVD), or another appropriate conformal deposition technique.

As discussed, any gap between corresponding nanoribbons of a specific device is filled by the liner 504. For example, as illustrated in FIG. 5B, the upper device 102b2 has two nanoribbons 118b2, and the liner 504 wraps around both the nanoribbons and merges, so as to eliminate any gap between the two nanoribbons of the device 102b2. Similarly, the two nanoribbons 118a2 of the device 102a2 are also wrapped around by the liner 504, and the liner 504 deposited around the first nanoribbon and the linear 504 around the second nanoribbon of the upper device 102a2 merge, so as to eliminate any gap between the two nanoribbons of the device 102a2. Similar linear 504 are also deposited around nanoribbons of the lower devices 102a1 and 102b1, as illustrated in FIG. 5B.

As illustrated in FIGS. 5A and 5B, a vertical gap between two vertically adjacent nanoribbons of a specific device is denoted as hg. In an example, the linear 504 has a thickness h1 that is at least hg/2, to eliminate the vertical gap of hg between the two nanoribbons of a specific device. For example, referring to the nanoribbons 118b2 of the device 102b2, if the top one of the nanoribbons 118b2 has a linear 504 of at least hg/2 thickness around it and if the bottom one of the nanoribbons 118b2 also has a linear 504 of at least hg/2 thickness around it, then the gap of hg between the two nanoribbons of the device 102b2 is completely filed with the liner 504. In an example, the gap hg is in the range of 1.5-15 nm, or in the subrange of 1.5-10 nm, 1.5-5 nm. 1.5-3 nm, 3-12 nm, 3-10 nm, 3-8 nm, 3-5 nm, 5-15 nm, 5-12 nm, 5-10 nm, 5-8 nm, or another appropriate sub-range thereof. Accordingly, the liner 504 has a thickness in the range of 1-9 nm.

As will be discussed herein later with respect to FIGS. 5E1-5E4, an etch process to etch the liner 504 and the nanoribbons 102a2, 102b2 of the upper devices may start from a top surface of the liner 504 around the nanoribbons of the upper devices, and the etch process continues downwards until the nanoribbons 102a2, 102b2 and the surrounding liner 504 of the upper devices are fully etched. If there is a gap between two vertically adjacent nanoribbons of a specific upper device that is not filed by the liner 504, sacrificial material 505 (discussed herein later) may be within such a gap, and the sacrificial material 505 may impede with the etch process. Accordingly, the liner 504 is made thick enough, to eliminate any void or gaps between vertically adjacent nanoribbons of a specific device.

Figure 5C:
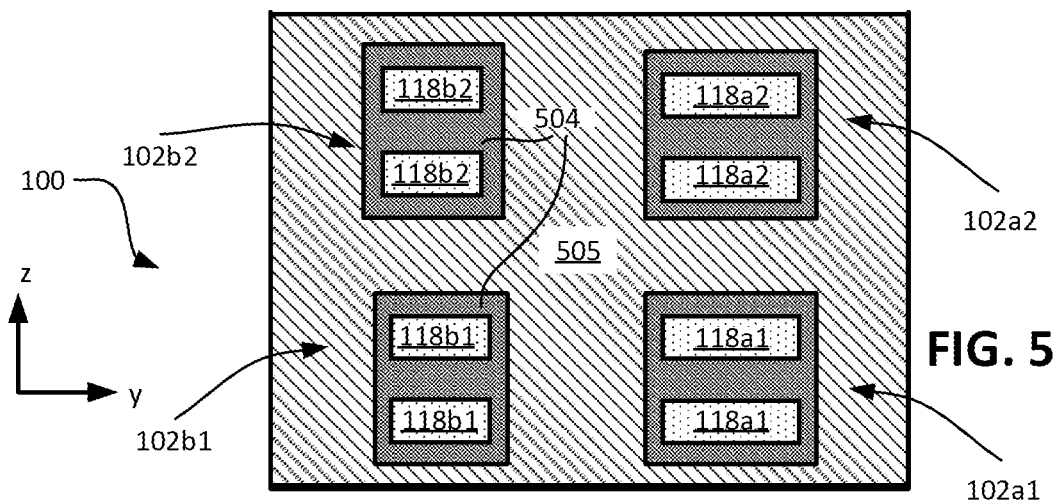

Referring again to FIG. 4, the method 400 then proceeds from 408 to 412, where sacrificial material 505 encapsulating the nanoribbons of the lower and upper devices is deposited, as illustrated in FIG. 5C. In an example, the sacrificial material 505 is etch selective to the material of the liner 504 and the nanoribbons 118a2 and 118b2 of the upper devices. For example, an etch process that etches the liner 504 and/or the nanoribbons 118a2 and 118b2 of the upper devices may not substantially etch the sacrificial material 505. Similarly, an etch process that etches the sacrificial material 505 may not substantially etch the liner 504. An example sacrificial material 505 is a carbon hardmask (CHM), although other materials that can be selectively etched may also be used.

Referring again to FIG. 4, the method 400 then proceeds from 412 to 416, where top portion of the sacrificial material 505 is recessed or otherwise removed, such that the sacrificial material 505 continues to fully encapsulate the liner 504 around all nanoribbons 118a1, 118b1 of the lower devices, and at least top surfaces of the liner 504 around nanoribbons of the upper devices 102a2, 102b2 is exposed, e.g., as illustrated in FIGS. 5D1, 5D2, and 5D3. In some embodiments where the sacrificial material 505 is a carbon hardmask, the recessing at 416 can be accomplished with an ashing process. In a more general sense, the recessing at 416 can be accomplished with an etch process that is selective to material of liner 504, such that sacrificial material 505 etches much faster than liner 504. Note that the depth of the recess can vary from one embodiment to the next.

For example, in FIG. 5D1, a relatively smaller portion of the sacrificial material 505 is removed (e.g., the sacrificial material 505 is recessed down to plane A, as indicated with a dashed line), such that the top surfaces of the liner 504 around nanoribbons of the upper devices 102a2, 102b2 are exposed through the recessed sacrificial material 505.

In FIG. 5D2, a relatively larger portion of the sacrificial material 505 is removed (e.g., the sacrificial material 505 is recessed down to plane B, as indicated with a dashed line), such that entirety of the nanoribbons 118b2 and 118a2 of the upper devices and the adjacent liner 504 are exposed, and the recessed sacrificial material 505 now barely covers the top surfaces of the liner 504 around the nanoribbons 118a1, 118b1 of the lower devices.

In FIG. 5D3, a relatively moderate portion of the sacrificial material 505 is removed (e.g., the sacrificial material 505 is recessed down to plane C, as indicated with a dashed line that is between planes A and C), such that some section of the liner 504 around the nanoribbons 118b2 and 118a2 of the upper devices is exposed, and a remaining section of the liner 504 around the nanoribbons 118b2 and 118a2 of the upper devices is still encapsulated by the sacrificial material 505.

Note that plane A of FIG. 5D1 denotes the minimum amount of sacrificial material 505 that may be removed, and plane B of FIG. 5D2 denotes the maximum amount of sacrificial material 505 that may be removed, according to some examples. Thus, the sacrificial material 505 can be recessed to be somewhere between planes A and B (also referred to herein as process window 515, see FIGS. 5D2 and 5D3), such as plane C illustrated in FIG. 5D3. In an example, a timed ashing or etch process may be employed to remove the sacrificial material 505, such that the top surface of the sacrificial material 505 is anywhere between planes A and B, i.e., within the process window 515.

Thus, the process window 515 is relatively large, e.g., as large as [h1+hg+(thickness of the two nanoribbons 118b2 of the upper device 102b2)], where h1 and hg are labelled in FIGS. and 5B. Accordingly, even if h1 is relatively small, the process window 515 can be relatively larger. Thus, the vertical separation h1 between nanoribbons of the upper and lower devices can be reduced (e.g., in the range of 3-50 nm, or in a smaller subrange of 3-12 nm), and it would still be possible to recess the sacrificial material 505 within the process window 515. Accordingly, as discussed, a smaller vertical separation h1 between nanoribbons of the upper and lower devices can be possible, without hampering the process of selectively removing the nanoribbons of the upper devices.

Various subsequent figures for subsequent process flows assumes that the sacrificial material 505 was recessed until plane C, as illustrated in FIG. 5D3. However, as discussed, the sacrificial material 505 can be recessed anywhere between planes A and B, as discussed herein above.

Referring again to FIG. 4, the method 400 then proceeds from 416 to 420, where the exposed liner 504 and the nanoribbons 118a2 and 118b2 of the upper devices are removed, e.g., etched using one or more isotropic etch processes, as illustrated in FIGS. 5E1, 5E2, 5E3, and 5E4. For example, an iterative removal process may be employed, where during a first etch process, initially the top and some side sections of the liner 504 outside the sacrificial material 505 may be removed, as illustrated in FIG. 5E1. Subsequently, during a second etch process, the top-most of the nanoribbons 118a2, 118b2 of the upper devices are removed, as illustrated in FIG. 5E2. During a subsequent third etch process, sections of the liner 504 between the nanoribbons in each upper devices 102a2 and 102b2 are removed, e.g., as illustrated in FIG. 5E3. This process is repeated, until the entire linear 504 around nanoribbons of the upper devices, as well as the nanoribbons of the upper devices, are completely removed, to form voids or recesses 509a and 509b, as illustrated in FIG. 5E4. Note that these etch processes are selective to the sacrificial material 505, in that they do not substantially impact or etch the sacrificial material 505 or the nanoribbons 118a1, 118b1 of the lower devices encapsulated by the sacrificial material 505. In an example, two or more of these etch processes may be combined in a single etch process, or may be broken down in further number of etch processes.

Figure 5F:
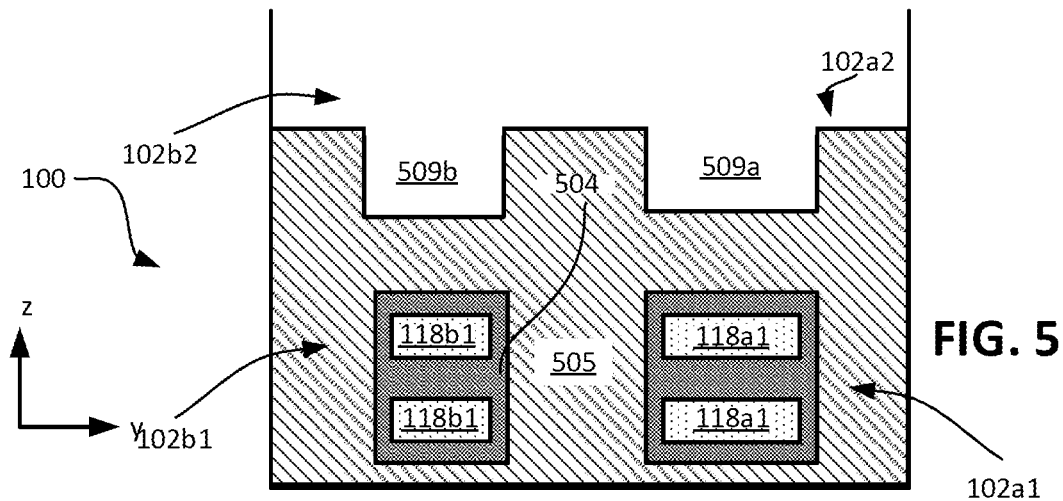
Figure 5F:
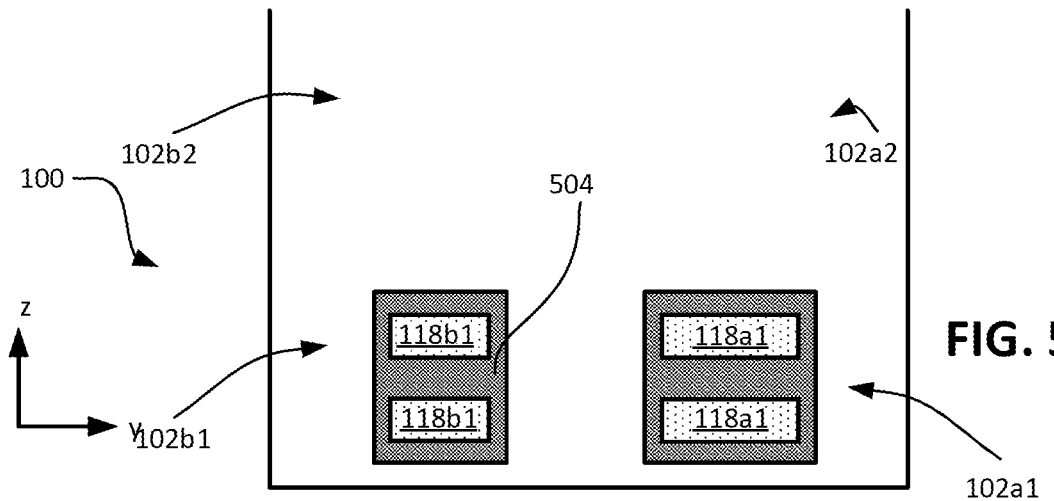

Referring again to FIG. 4, the method 400 then proceeds from 420 to 424, where the sacrificial material 505 is removed, e.g., via a selective etch process that removes the sacrificial material 505, without substantially impacting the liner 504 around the nanoribbons 118a1 and 118b1 and hence, without substantially impacting the nanoribbons 118a1 and 118b1 of the lower devices, e.g., as illustrated in FIG. 5F.

Figure 5G:
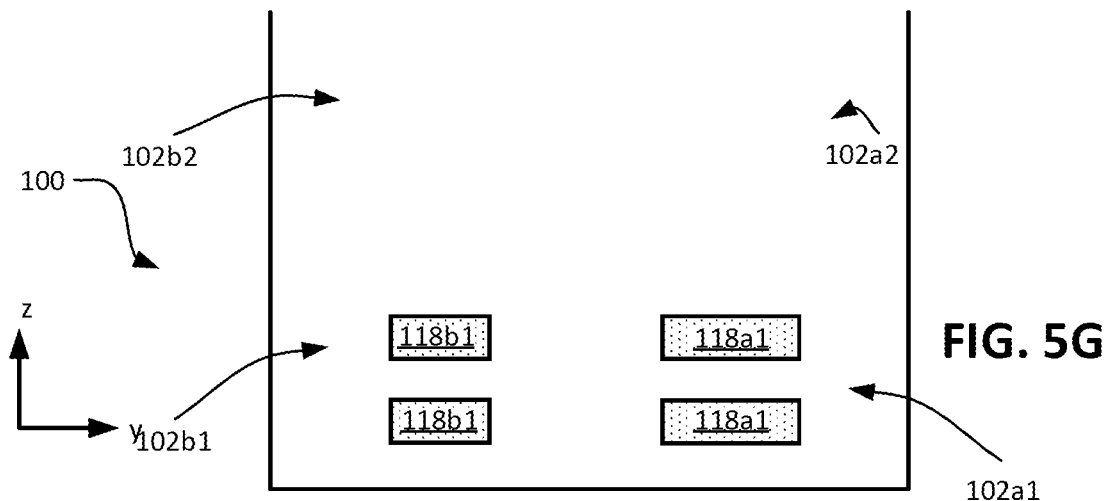

Referring again to FIG. 4, the method 400 then proceeds from 424 to 428, where the liner 504 from around the nanoribbons 118a1, 118b1 of the lower devices is removed, e.g., using an appropriate isotropic etch process, as illustrated in FIG. 5G. The etch process is selective and removes the liner 504, without substantially impacting the nanoribbons 118a1, 118b1 of the lower devices.

Figure 5H:
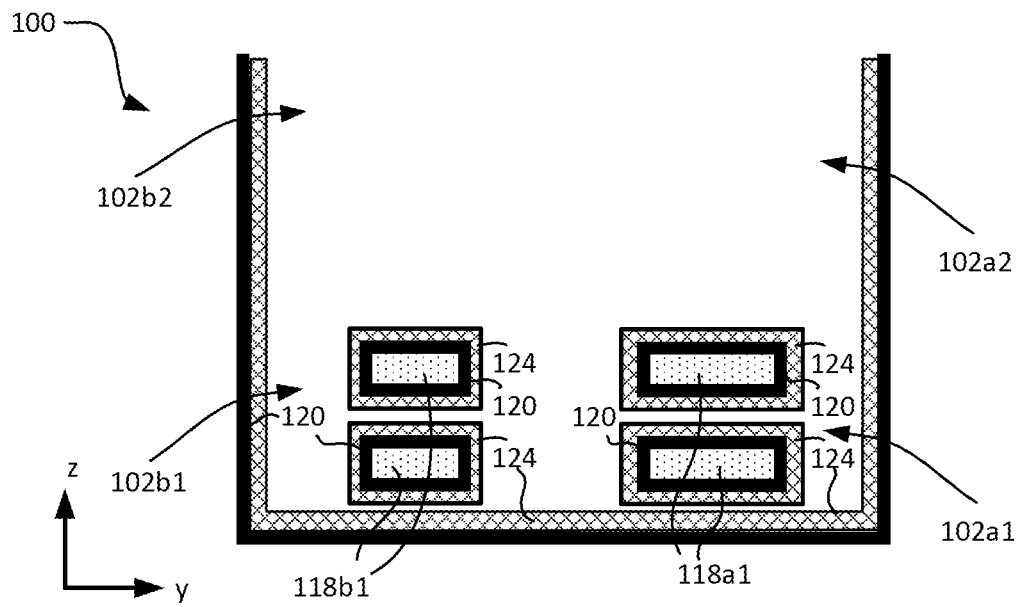
Figure 5I:
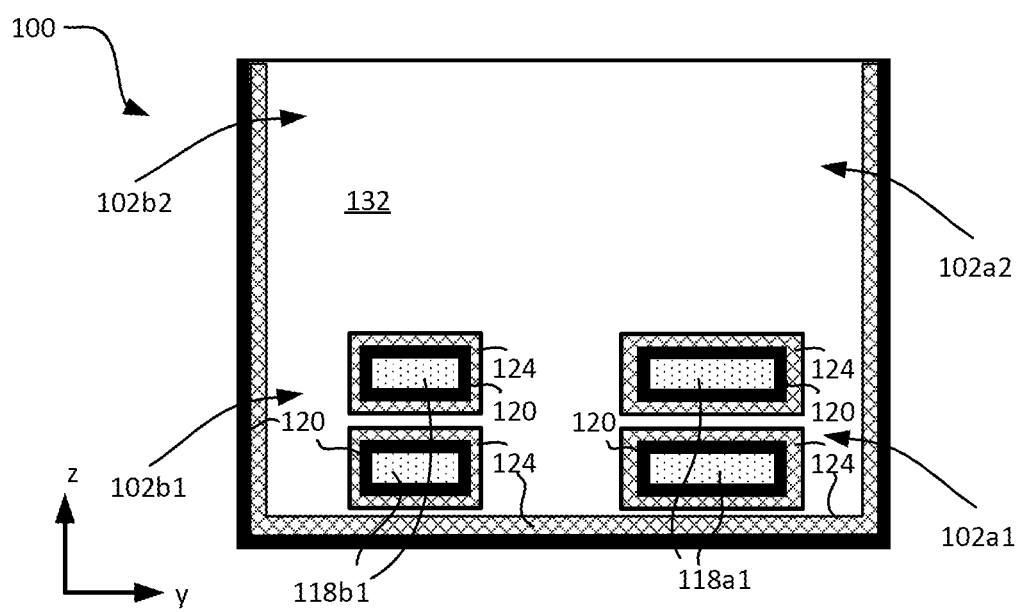

Referring again to FIG. 4, the method 400 then proceeds from 428 to 432, where gate dielectric 120 and work function metal 124 are deposited around the nanoribbons 118a1, 118b1 of the lower devices and also on sidewalls of the inner spacers 134, and subsequently the gate electrode 132 is deposited, as illustrated in FIGS. 5H and 5I. The gate dielectric 120 (and also the work function metal 124) separates the gate electrode 132 from the end sections of the nanoribbons 118a2, 118b2 and also from the nanoribbons 118a1, 118b1, as previously discussed with respect to FIGS. 1B and 1C. Note that in FIG. 5I, the gate electrode 132 is common for both the lower and upper devices, e.g., as discussed with respect to FIGS. 1A-1C.

In other embodiments (such as illustrated in FIGS. 2A and 2B), subsequent to the formation of a lower gate electrode 132a, the isolation region 209 may be formed above the lower gate electrode 132a, and then the upper gate electrode 132b may be formed above the isolation region 209. This results in the gate electrode 132a for the lower devices and the gate electrode 132b for the upper devices, as discussed herein previously with respect to FIGS. 2A-2B.

The method 400 of FIG. 4 then proceeds from 432 to 436, where source and drain contacts are formed, which couple the various source and drain regions to one or more metallization levels. The source and drain contacts can be formed using any suitable techniques, such as forming contact trenches in an ILD layer adjacent to the respective source and drain regions, and then depositing metal or metal alloy (or other suitable electrically conductive material) in the trenches. In some embodiments, forming the source and drain contacts may include silicidation, germanidation, III-V-idation, and/or annealing processes, for example.

The method 400 of FIG. 4 then proceeds from 436 to 440, where a general integrated circuit (IC) is completed, as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure.

Note that the processes in method 400 are shown in a particular order for ease of description. However, one or more of the processes may be performed in a different order or may not be performed at all (and thus be optional), in accordance with some embodiments. Numerous variations on method 400 and the techniques described herein will be apparent in light of this disclosure.

Figure 6:
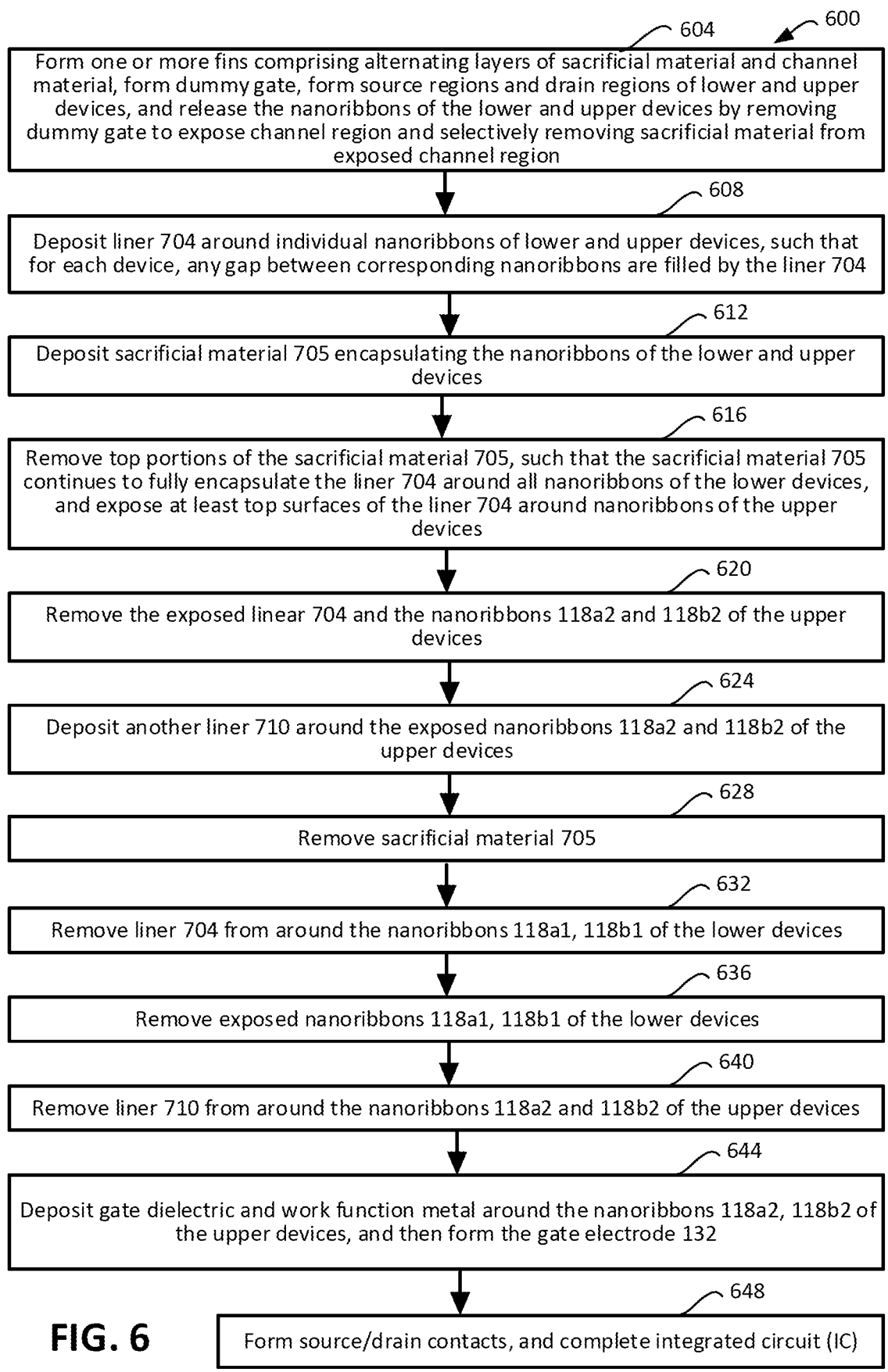
FIG. 6 illustrates a flowchart depicting a method of forming the example nanoribbon semiconductor structure of FIGS. 3A-3B, in accordance with an embodiment of the present disclosure.

FIG. 6 illustrates a flowchart depicting a method 600 of forming the example nanoribbon semiconductor structure 300 of FIGS. 3A-3B, in accordance with an embodiment of the present disclosure. FIGS. 7A, 7B, 7C, 7D1, 7D2, 7D3, 7E, 7F, 7G, 7H, 7I, 7J, and 7K collectively illustrate cross-sectional views of an example semiconductor structure (e.g., the semiconductor structure 300 of FIGS. 3A-3B) in various stages of processing, in accordance with an embodiment of the present disclosure. FIGS. 6 and 7A-7K will be discussed in unison. The cross-sectional views of FIGS. 7A-7K correspond to the cross-sectional view of FIG. 3A.

Referring to FIG. 6, the method 600 includes, at 604, forming one or more fins comprising alternating layers of sacrificial material and channel material of one or more upper devices (e.g., devices 102a2, 102b2) and one or more lower devices (e.g., devices 102a1, 102b1), forming dummy gate, forming source regions and drain regions of lower and upper devices (e.g., source regions 106a1, 106a2, and drain regions 108a1, 108a2), and releasing the nanoribbons (e.g., nanoribbons 118a1 of device 102a1, nanoribbons 118a2 of device 102a2, nanoribbons 118b1 of device 102b1, and nanoribbons 118b2 of device 102b2) of the lower and upper devices by removing the dummy gate to expose the channel region and then selectively removing sacrificial material from exposed channel region. The final structure subsequent to process 604 is illustrated in the cross-sectional view of FIG. 7A. Note that the process 604 is similar to the process 404 of the method 400 of FIG. 4. The process 604 may include any appropriate techniques for forming nanoribbons of a stacked GAA device architecture having a lower device, and an upper device stacked above the lower device. As discussed herein previously, the upper devices are one of PMOS or NMOS devices, and the lower devices are another of PMOS or NMOS devices.

Figure 7A:
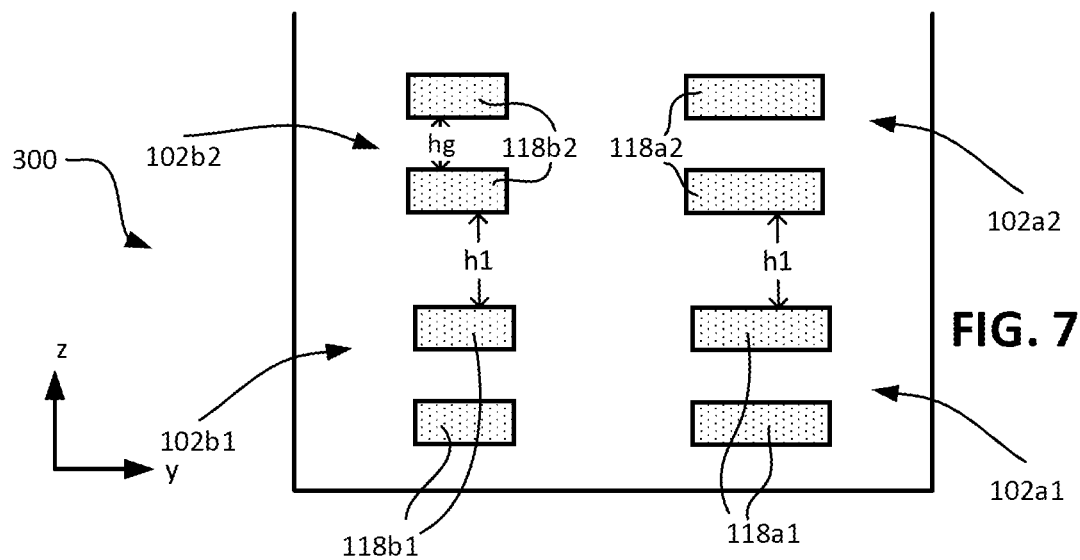
Figure 7B:
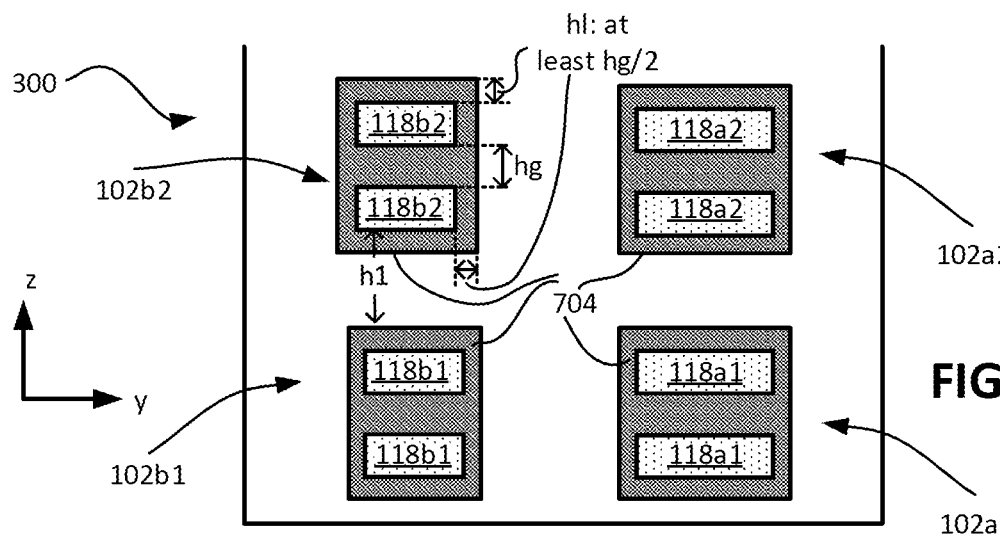

Referring again to FIG. 6, the method 600 then proceeds from 604 to 608, where liner 704 encapsulating or wrapping around the nanoribbons of the lower and upper devices are deposited, such that for each device, any gap between corresponding nanoribbons is filled by the liner 704, e.g., as illustrated in FIG. 7B. The process 608 of depositing the liner 704 in FIG. 7B is similar to the process 408 of depositing the liner 504 in FIG. 5B, and that previous relevant discussion is equally applicable here.

Figure 7C:
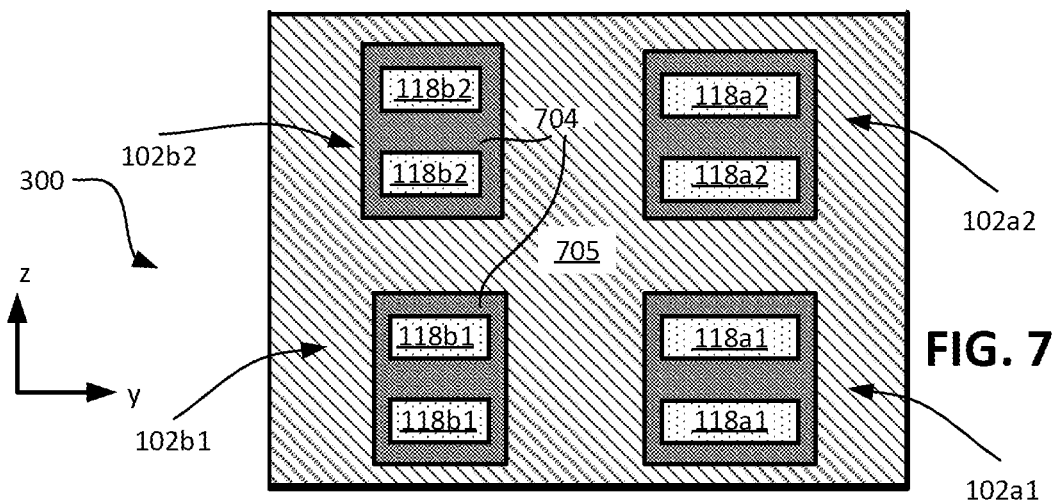

Referring again to FIG. 6, the method 600 then proceeds from 608 to 612, where sacrificial material 705 encapsulating the nanoribbons of the lower and upper devices is deposited, as illustrated in FIG. 7C. The process 612 of depositing the sacrificial material 705 in FIG. 7C is similar to the process 412 of depositing the sacrificial material 505 in FIG. 5C, and that previous relevant discussion is equally applicable here.

Referring again to FIG. 6, the method 600 then proceeds from 612 to 616, where top portion of the sacrificial material 705 is removed, such that the sacrificial material 705 continues to fully encapsulate the liner 704 around all nanoribbons 118a1, 118b1 of the lower devices, and exposes at least top surfaces of the liner 704 around nanoribbons of the upper devices 102a2, 102b2, e.g., as illustrated in FIGS. 7D1, 7D2, and 7D3.

The process 616 of removing the top portions of the sacrificial material 705 (e.g., as illustrated in FIGS. 7D1, 7D2, 7D3) is similar to the process 416 of removing the top portions of the sacrificial material 505 (e.g., as illustrated in FIGS. 5D1, 5D2, 5D3), and that previous relevant discussion is equally applicable here. Furthermore, the etching process window 715 illustrated in FIG. 7D2 is similar to the etching process window 515 illustrated in FIG. 5D2. As also discussed with respect to FIGS. 5D1-5D3, in the structure 300 illustrated in FIGS. 7A-7D3, the vertical separation h1 (see FIGS. 7A-7B) between nanoribbons of the upper and lower devices can be reduced (e.g., in the range of 3-50 nm, or in a smaller subrange of 3-12 nm), and it would still be possible to recess the sacrificial material 705 within the process window 715. Accordingly, as discussed, a smaller vertical separation h1 between nanoribbons of the upper and lower devices can be achieved. Various subsequent figures for subsequent process flow assumes that the sacrificial material 705 was recessed down to plane C, as illustrated in FIG. 7D3. However, as previously discussed, the sacrificial material 705 can be recessed to anywhere between planes A and B illustrated in FIGS. 7D1-7D3.

Figure 7E:
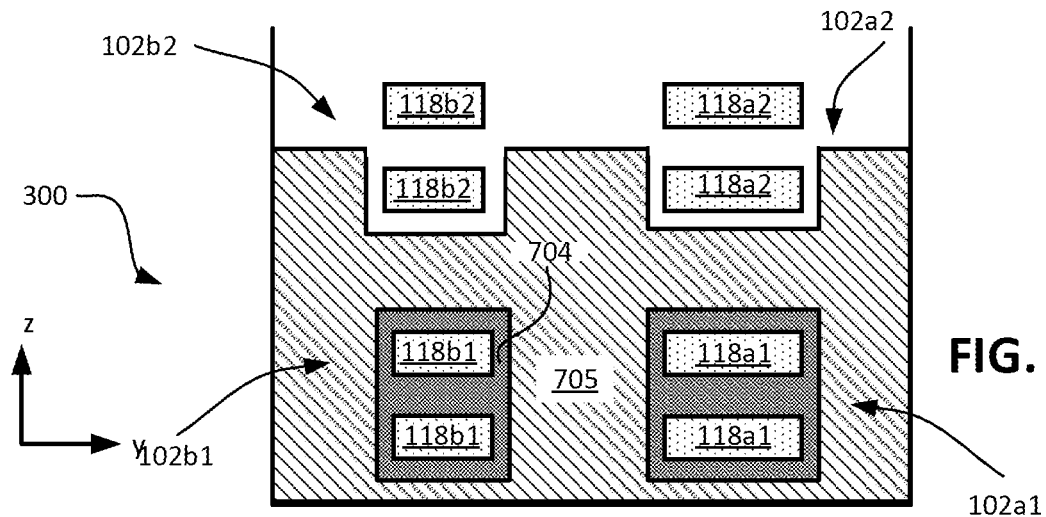
Figure 7F:
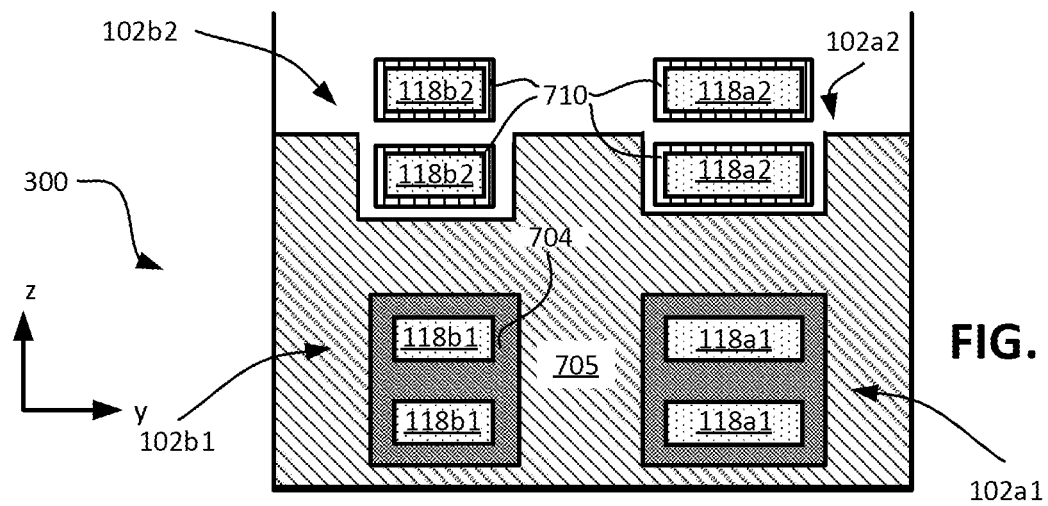

Referring again to FIG. 6, the method 600 then proceeds from 616 to 620, where the exposed liner 704 around the nanoribbons 118a2 and 118b2 of the upper devices is removed, e.g., etched using an isotropic etch process, as illustrated in FIG. 7F. Note that in the process 420 of FIG. 4, both liner 504 and the nanoribbons 118a2, 118b2 of the upper devices were removed (e.g., see FIGS. 5E1-5E4). In contrast, in the process 620 of FIG. 6, only the exposed liner 704 around the nanoribbons 118a2 and 118b2 of the upper devices is removed, without substantially removing the nanoribbons 118a2 and 118b2, as illustrated in FIG. 7E. Note that the etch process is selective in that it does not substantially impact or etch the nanoribbons 118a2, 118b2 of the upper devices and also does not substantially impact or etch the sacrificial material 705. Thus, in FIG. 7E, the nanoribbons 118a2, 118b2 of the upper devices are no longer wrapped around by the liner 704 or the sacrificial material 705.

Referring again to FIG. 6, the method 600 then proceeds from 620 to 624, where another liner 710 is deposited around the exposed nanoribbons 118a2 and 118b2 of the upper devices, as illustrated in FIG. 7F. In an example, a thickness of the liner 710 may be less than the thickness of the liner 704. For example, as previously discussed herein (e.g., with respect to the liner 504, which is also applicable for the liner 704), the liner 704 has to be thick enough, so as to eliminate any gap between vertically adjacent nanoribbons of a specific device. In contrast, as illustrated in FIG. 7F, after deposition of the liner 710 on the nanoribbons 118a2 and 118b2, there may (or may not) be any gap between vertically adjacent nanoribbons of a specific upper device. In an example, the material of the liner 710 is selected to be etch selective to the material of the nanoribbons, the sacrificial material 705, and the liner 704. For example, an etch process to etch the liner 710 may not substantially etch the nanoribbons 118, and an etch process to etch the nanoribbons 118 may not substantially etch the liner 710. Similarly, an etch process to etch the sacrificial material 705 may not substantially etch the liner 710. Similarly, an etch process to etch the liner 704 may not substantially etch the liner 710. Merely as an example, the liner 710 may comprise titanium nitride (TiN). The liner 710 may be deposited around the exposed nanoribbons 118a2 and 118b2 of the upper devices using an appropriate deposition process (e.g., a conformal deposition process), such as CVD, PVD, ALD, VPE, MBE, or LPE, for example.

Figure 7G:
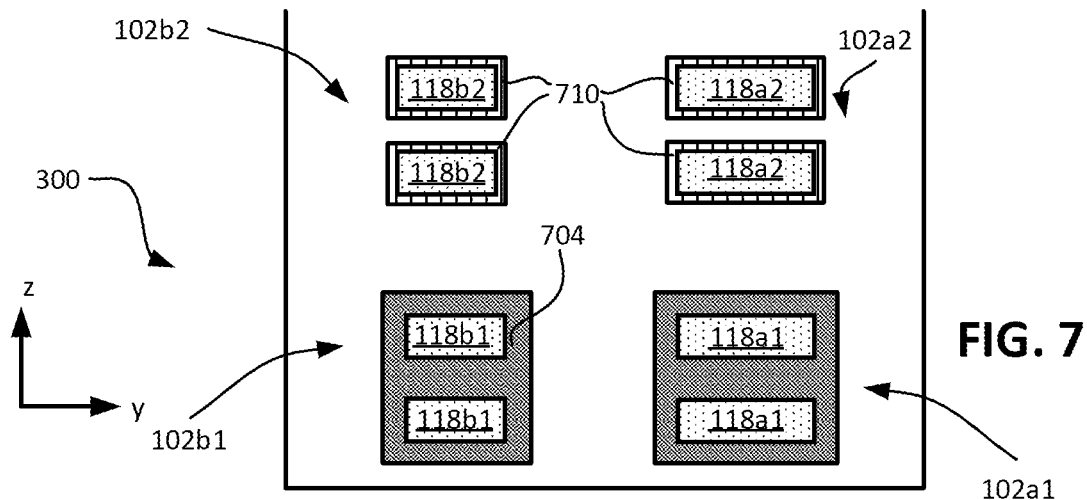

Referring again to FIG. 6, the method 600 then proceeds from 624 to 628, where the sacrificial material 705 is removed, as illustrated in FIG. 7G. For example, an appropriate selective isotropic etch process may be used to remove the sacrificial material 705, without substantially etching the liner 710 protecting the nanoribbons 118a2, 118b2 of the upper devices and optionally without substantially etching the liner 704 protecting the nanoribbons 118a1, 118b1 of the lower devices.

Figure 7H:
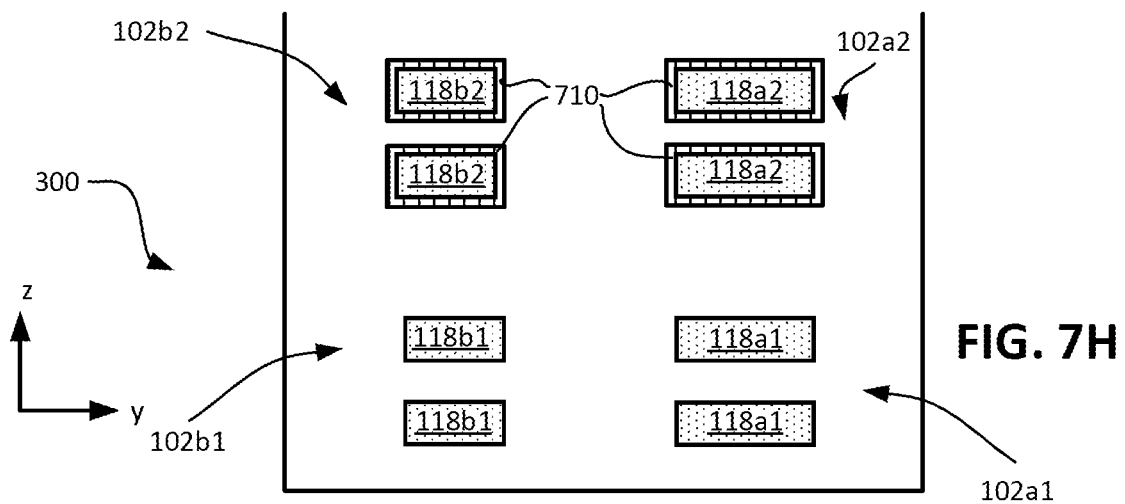

Referring again to FIG. 6, the method 600 then proceeds from 628 to 632, where the liner 704 from around the nanoribbons 118a1, 118b1 of the lower devices is removed, as illustrated in FIG. 7H. For example, an appropriate selective isotropic etch process may be used to remove the liner 704 from around the nanoribbons 118a1, 118b1 of the lower devices, without substantially etching the liner 710 protecting the nanoribbons 118a2, 118b2 of the upper devices. Thus, the nanoribbons 118a1, 118b1 of the lower devices are now exposed, while the nanoribbons 118a2, 118b2 of the upper devices are still wrapped around by the liner 710, as illustrated in FIG. 7H.

In an example, the etch or removal processes 628 and 632 may be combined in a single etch process that etches the sacrificial material 705 and the liner 704, without substantially etching the liner 710.

Figure 7I:
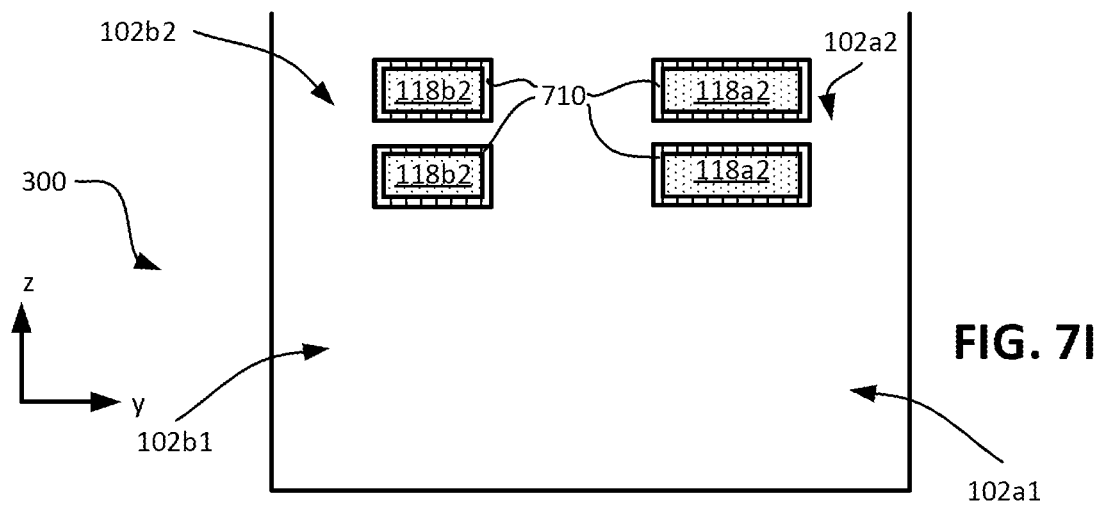

Referring again to FIG. 6, the method 600 then proceeds from 632 to 636, where the exposed nanoribbons 118a1, 118b1 of the lower devices are removed, as illustrated in FIG. 7I. For example, an appropriate selective isotropic etch process may be used to remove the nanoribbons 118a1, 118b1 of the lower devices, without substantially etching the liner 710 protecting the nanoribbons 118a2, 118b2 of the upper devices. Thus, the nanoribbons 118a1, 118b1 of the lower devices are removed, while the nanoribbons 118a2, 118b2 of the upper devices are still wrapped around by the liner 710, as illustrated in FIG. 7I.

In an example, the etch or removal processes 628, 632, and/or 636 may be combined in a single etch process that etches the sacrificial material 705, the liner 704, and the nanoribbons 118a1, 118b1 of the lower devices, without substantially etching the liner 710 that protects the nanoribbons 118a2, 118b2 of the upper devices.

Figure 7J:
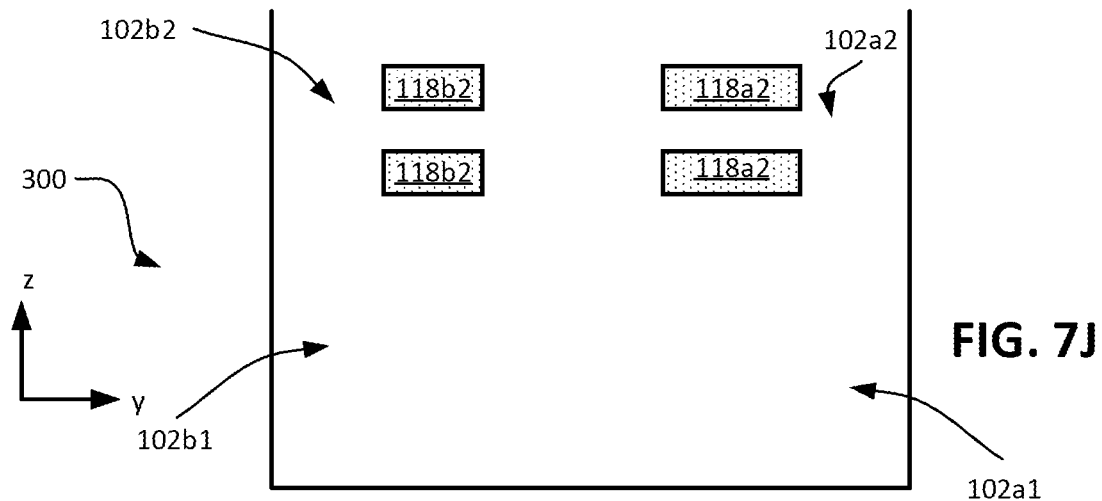

Referring again to FIG. 6, the method 600 then proceeds from 636 to 640, where the liner 710 is removed from around the nanoribbons 118a2 and 118b2 of the upper devices, as illustrated in FIG. 7J. For example, an appropriate selective isotropic etch process may be used to remove the liner 710, without substantially etching the nanoribbons 118a2, 118b2 of the upper devices.

Figure 7K:
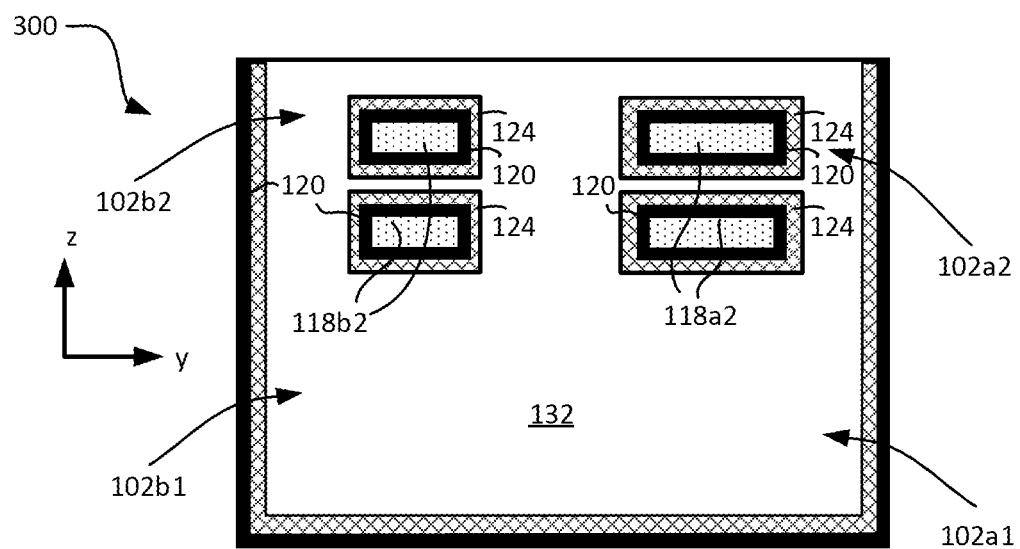

Referring again to FIG. 6, the method 600 then proceeds from 640 to 644, where gate dielectric 120 and work function metal 124 are deposited around the nanoribbons 118a2, 118b2 of the upper devices and also on sidewalls of the inner spacers 134, and subsequently the gate electrode 132 is deposited, as illustrated in FIG. 7K. The gate dielectric 120 (and also the work function metal 124) separates the gate electrode 132 from the end sections of the nanoribbons 118a1, 118b1 and also from the nanoribbons 118a2, 118b2, as previously discussed with respect to FIG. 3B. Note that in FIG. 7K, the gate electrode 132 is common for both the lower and upper devices, e.g., as discussed with respect to FIGS. 3A-3B.

In other embodiments and although not illustrated in FIG. 7K, subsequent to the formation of a lower gate electrode 132, an isolation region may be formed above the lower gate electrode, and then the upper gate electrode may be formed above the isolation region (e.g., similar to the lower and upper gate electrodes 132a, 132b, and the isolation region 209 of FIGS. 2A-2B). This results in the lower gate electrode for the lower devices and the upper gate electrode for the upper devices, where the two gate electrodes are separated by an isolation region, e.g., similar to the structure 200 discussed herein previously with respect to FIGS. 2A-2B.

The method 600 of FIG. 6 then proceeds from 644 to 648, where source and drain contacts are formed (not illustrated) and where a general integrated circuit (IC) is completed, as desired. The process 648 has been discussed herein previously with respect to processes 436 and 440 of the method 400 of FIG. 4.

Note that the processes in method 600 are shown in a particular order for ease of description. However, one or more of the processes may be performed in a different order or may not be performed at all (and thus be optional), in accordance with some embodiments. Numerous variations on method 600 and the techniques described herein will be apparent in light of this disclosure.

Example System

Figure 8:
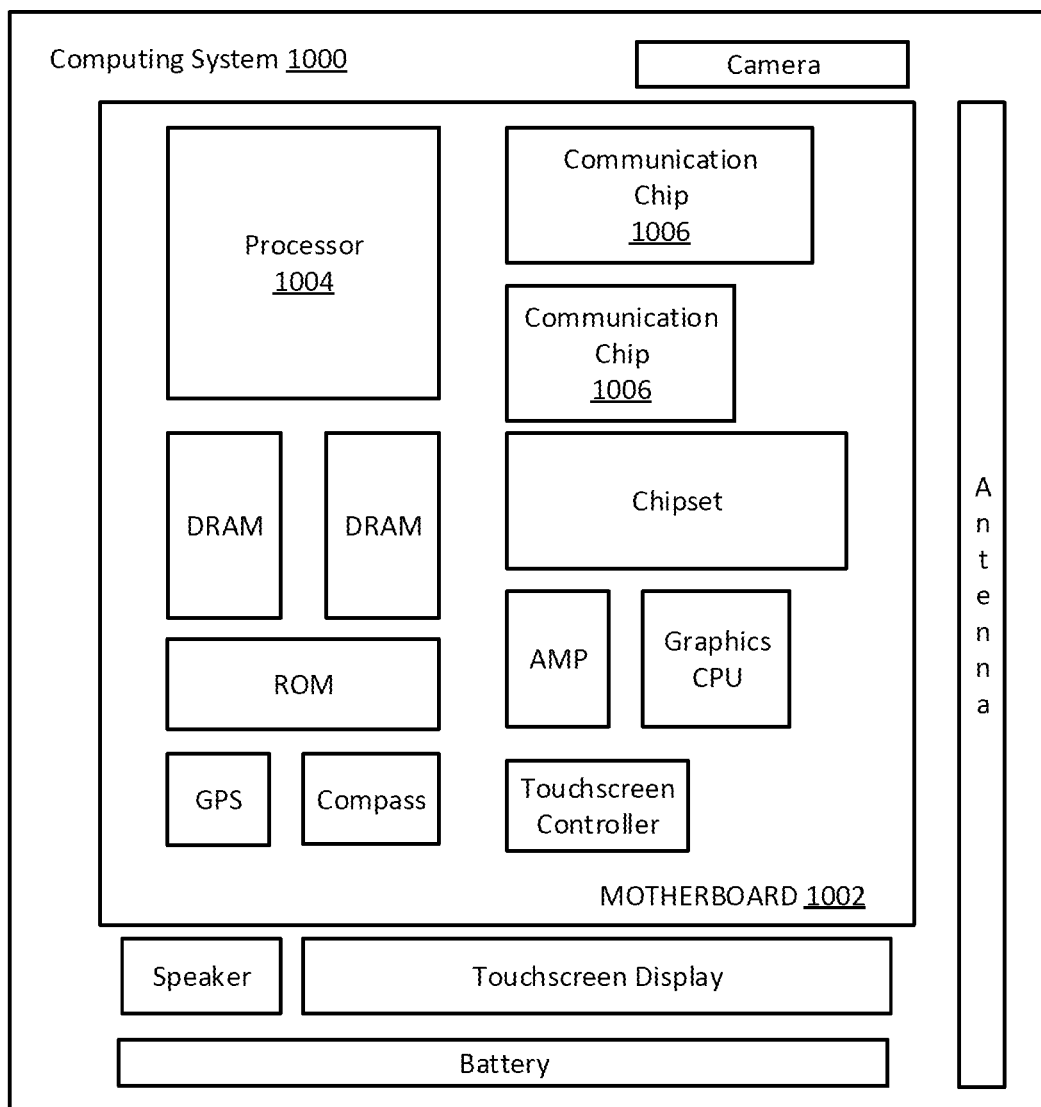
FIG. 8 illustrates a computing system implemented with integrated circuit structures and/or transistor devices formed using the techniques disclosed herein, in accordance with some embodiments of the present disclosure.

FIG. 8 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. A semiconductor structure comprising: an upper device stacked over a lower device, wherein the upper device comprises (i) a first source region, (ii) a first drain region, (iii) a body of semiconductor material extending laterally from the first source region to the first drain region, and (iv) a first gate structure at least in part wrapped around the body, and wherein the lower device comprises (i) a second source region, (ii) a second drain region, and (iii) a second gate structure at least in part laterally between the second source region and the second drain region, and wherein the lower device lacks a body of semiconductor material extending laterally from the second source region to the second drain region.

Example 2. The semiconductor structure of example 1, wherein the first gate structure includes a first gate electrode and the second gate structure includes a second gate electrode, with a layer of non-conductive material between the first gate electrode and the second gate electrode.

Example 3. The semiconductor structure of example 1, wherein the first gate structure includes a first gate electrode and the second gate structure includes a second gate electrode, and wherein the first gate electrode and the second gate electrode form a continuous gate electrode structure, without any intervening layer between the first gate electrode and the second gate electrode.

Example 4. The semiconductor structure of any one of examples 1-3, wherein the body is a first body, and wherein the lower device comprises a discontinuous second body comprising (i) a first end section in contact with the second source region, and (ii) a second end section in contact with the second drain region, the second body lacking a middle region between the first end section and the second end section.

Example 5. The semiconductor structure of example 4, wherein the second gate structure includes (i) a gate electrode, and (ii) gate dielectric material that is between the gate electrode and the first end section of the second body, and that is also between the gate electrode and the second end section of the second body.

Example 6. The semiconductor structure of any one of examples 4-5, further comprising: a gate spacer separating the first gate structure from the first source region, and separating the second gate structure from the second source region, wherein the first end section of the second body is at least in part wrapped around by the gate spacer.

Example 7. The semiconductor structure of example 6, wherein the gate spacer is a first gate spacer, and wherein the semiconductor structure further comprises: a second gate spacer separating the first gate structure from the first drain region, and separating the second gate structure from the second drain region, wherein the second end section of the second body is at least in part wrapped around by the second gate spacer.

Example 8. The semiconductor structure of any one of examples 4-7, wherein a vertical distance between a top surface of the first end section of the second body and a bottom surface of the first body is in a range of 3-12 nanometers (nm).

Example 9. The semiconductor structure of any one of examples 4-8, wherein the first end section and the second end section of the second body are coplanar.

Example 10. The semiconductor structure of any one of examples 1-9, wherein: the first source region is above the second source region, and separated from the second source region by a non-conductive material.

Example 11. The semiconductor structure of any one of examples 1-10, wherein: the first drain region is above the second drain region, and separated from the second drain region by a non-conductive material.

Example 12. The semiconductor structure of any one of examples 1-11, wherein the body is a first body, and wherein the upper device further comprises: a second body comprising the semiconductor material extending laterally between the first source region and the first drain region, wherein the first body and the second body are included in a vertical stack including two or more nanowires, nanoribbons, or nanosheets.

Example 13. The semiconductor structure of any one of examples 1-12, wherein the upper device is one of an n-channel metal-oxide semiconductor (NMOS) device or a p-channel metal-oxide semiconductor (PMOS) device, and the lower device is the other of an NMOS device or a PMOS device.

Example 14. The semiconductor structure of any one of examples 1-13, wherein the upper device is a first upper device, the lower device is a first lower device, and wherein the semiconductor structure further comprises: a second upper device stacked over a second lower device, wherein the second upper device comprises (i) a third source region, (ii) a third drain region, (iii) a body of semiconductor material extending laterally from the third source region to the third drain region, and (iv) a third gate structure at least in part wrapped around the body of semiconductor material extending laterally from the third source region to the third drain region, and wherein the second lower device comprises (i) a fourth source region, (ii) a fourth drain region, (iii) a body of semiconductor material extending laterally from the fourth source region to the fourth drain region, and (iv) a fourth gate structure at least in part wrapped around the body of semiconductor material extending laterally from the fourth source region to the fourth drain region.

Example 15. The semiconductor structure of any one of examples 1-14, wherein the body of semiconductor material extending laterally from the first source region to the first drain region is a nanoribbon, around which the first gate structure is wrapped.

Example 16. The semiconductor structure of any one of examples 1-15, wherein the body of semiconductor material extending laterally from the first source region to the first drain region is a nanowire or a nanosheet, around which the first gate structure is wrapped.

Example 17. The semiconductor structure of any one of examples 1-16, wherein the body of semiconductor material extending laterally from the first source region to the first drain region is a fin, around which the first gate structure is at least partially wrapped.

Example 18. An integrated circuit structure comprising: an upper device stacked over a lower device, wherein the lower device comprises (i) a lower source region, (ii) a lower drain region, and (iii) a continuous lower body of semiconductor material extending laterally from the lower source region to the lower drain region, and wherein the upper device comprises (i) an upper source region, (ii) an upper drain region, and (iii) a discontinuous upper body of semiconductor material having a first end section extending laterally from the upper source region and a second end section extending laterally from the upper drain region, wherein the upper body is discontinuous in that it lacks a central region between the first end section and the second end section.

Example 19. The integrated circuit of example 18, wherein a vertical distance between the continuous lower body and the discontinuous upper body is in the range of 3-12 nanometers.

Example 20. The integrated circuit of any one of examples 18-19, further comprising: a gate structure at least in part wrapped around the continuous lower body, and not wrapped around the discontinuous upper body; and a first spacer between the gate structure and the upper and lower source regions, and a second spacer between the gate structure and the upper and lower drain regions, wherein the first spacer warps around the first end section of the upper body, and the second spacer warps around the second end section of the upper body.

Example 21. The integrated circuit of any one of examples 18-19, further comprising: a gate structure at least in part wrapped around the body continuous lower body, and not wrapped around the discontinuous upper body.

Example 22. The integrated circuit structure of example 21, wherein the gate structure comprises: a gate electrode; and gate dielectric material between the lower body and the gate electrode, and between the first and second end sections of the upper body and the gate electrode.

Example 23. An integrated circuit structure comprising: an upper device stacked over a lower device, wherein the upper device comprises a continuous nanoribbon extending laterally from an upper source region to an upper drain region, and wherein the lower device comprises discontinuous nanoribbon having a first end section extending from a lower source region, a second end section extending from a lower drain region, and lacking a middle region between the first and second end sections.

Example 24. The integrated circuit of example 23, wherein a vertical distance between a bottom surface of the continuous nanoribbon and a top surface of the discontinuous nanoribbon is in the range of 3-12 nanometers.

Example 25. The integrated circuit of any one of examples 23-24, wherein the first end section and the second end section are coplanar.

Example 26. The integrated circuit of example 25, wherein the first end section and the second end section of the discontinuous nanoribbon are separated by a gate structure that wraps around the continuous nanoribbon.

Example 27. The integrated circuit of example 26, wherein the gate structure does not wrap around the discontinuous nanoribbon.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A semiconductor structure comprising:
an upper device stacked over a lower device,
wherein the upper device comprises (i) a first source region, (ii) a first drain region, (iii) a body of semiconductor material extending laterally from the first source region to the first drain region, and (iv) a first gate structure at least in part wrapped around the body, and
wherein the lower device comprises (i) a second source region, (ii) a second drain region, and (iii) a second gate structure at least in part laterally between the second source region and the second drain region, and wherein the lower device lacks a body of semiconductor material extending laterally from the second source region to the second drain region.

2. The semiconductor structure of claim 1, wherein the first gate structure includes a first gate electrode and the second gate structure includes a second gate electrode, with a layer of non-conductive material between the first gate electrode and the second gate electrode.

3. The semiconductor structure of claim 1, wherein the first gate structure includes a first gate electrode and the second gate structure includes a second gate electrode, and wherein the first gate electrode and the second gate electrode form a continuous gate electrode structure, without any intervening layer between the first gate electrode and the second gate electrode.

4. The semiconductor structure of claim 1, wherein the body is a first body, and wherein the lower device comprises a discontinuous second body comprising (i) a first end section in contact with the second source region, and (ii) a second end section in contact with the second drain region, the second body lacking a middle region between the first end section and the second end section.

5. The semiconductor structure of claim 4, wherein the second gate structure includes (i) a gate electrode, and (ii) gate dielectric material that is between the gate electrode and the first end section of the second body, and that is also between the gate electrode and the second end section of the second body.

6. The semiconductor structure of claim 4, further comprising:
a gate spacer separating the first gate structure from the first source region, and separating the second gate structure from the second source region,
wherein the first end section of the second body is at least in part wrapped around by the gate spacer.

7. The semiconductor structure of claim 6, wherein the gate spacer is a first gate spacer, and wherein the semiconductor structure further comprises:
a second gate spacer separating the first gate structure from the first drain region, and separating the second gate structure from the second drain region,
wherein the second end section of the second body is at least in part wrapped around by the second gate spacer.

8. The semiconductor structure of claim 4, wherein a vertical distance between a top surface of the first end section of the second body and a bottom surface of the first body is in a range of 3-12 nanometers (nm).

9. The semiconductor structure of claim 4, wherein the first end section and the second end section of the second body are coplanar.

10. The semiconductor structure of claim 1, wherein:
the first source region is above the second source region, and separated from the second source region by a non-conductive material.

11. The semiconductor structure of claim 1, wherein:
the first drain region is above the second drain region, and separated from the second drain region by a non-conductive material.

12. The semiconductor structure of claim 1, wherein the body is a first body, and wherein the upper device further comprises:
a second body comprising the semiconductor material extending laterally between the first source region and the first drain region, wherein the first body and the second body are included in a vertical stack including two or more nanowires, nanoribbons, or nanosheets.

13. An integrated circuit structure comprising:
an upper device stacked over a lower device,
wherein the upper device comprises a continuous nanoribbon extending laterally from an upper source region to an upper drain region, and
wherein the lower device comprises a discontinuous nanoribbon having a first end section extending from a lower source region, a second end section extending from a lower drain region, and lacking a middle region between the first and second end sections.

14. The integrated circuit structure of claim 13, wherein a vertical distance between a bottom surface of the continuous nanoribbon and a top surface of the discontinuous nanoribbon is in the range of 3-12 nanometers.

15. The integrated circuit structure of claim 13, wherein the first end section and the second end section are coplanar.

16. The integrated circuit structure of claim 15, wherein the first end section and the second end section of the discontinuous nanoribbon are separated by a gate structure that wraps around the continuous nanoribbon.

* * * * *